United States Patent
Srinivasan et al.

(10) Patent No.: US 11,114,143 B2
(45) Date of Patent: Sep. 7, 2021

(54) BIPOLAR DECODER FOR CROSSPOINT MEMORY CELLS

(71) Applicant: Intel Corporation, Santa Clara, CA (US)

(72) Inventors: Balaji Srinivasan, Folsom, CA (US); Sandeep K. Guliani, Folsom, CA (US); DerChang Kau, Cupertino, CA (US); Ashir G. Shah, El Dorado Hills, CA (US)

(73) Assignee: Intel Corporation, Santa Clara, CA (US)

( * ) Notice: Subject to any disclaimer, the term of this patent is extended or adjusted under 35 U.S.C. 154(b) by 26 days.

(21) Appl. No.: 16/283,128

(22) Filed: Feb. 22, 2019

(65) Prior Publication Data
US 2020/0273508 A1     Aug. 27, 2020

(51) Int. Cl.
*G11C 8/10*     (2006.01)
*G06F 3/06*     (2006.01)

(52) U.S. Cl.
CPC .............. *G11C 8/10* (2013.01); *G06F 3/0604* (2013.01); *G06F 3/0655* (2013.01); *G06F 3/0679* (2013.01)

(58) Field of Classification Search
CPC ........... G11C 8/10; G11C 16/08; G11C 16/24; G11C 7/12; G06F 3/0604; G06F 3/0655; G06F 3/0679
See application file for complete search history.

(56) References Cited

U.S. PATENT DOCUMENTS

| 4,825,413 | A | 4/1989 | Tran |
| 5,283,481 | A | 2/1994 | Klimanis et al. |
| 5,327,381 | A * | 7/1994 | Johnson .................. G11C 8/10 365/200 |
| 7,382,647 | B1 | 6/2008 | Gopalakrishnan |
| 8,842,491 | B2 | 9/2014 | Gopalakrishnan et al. |
| 9,613,676 | B1 * | 4/2017 | Wang .................. G11C 11/2255 |
| 9,875,783 | B2 | 1/2018 | Dray et al. |
| 2001/0053093 | A1 | 12/2001 | Ogura et al. |
| 2004/0076037 | A1 * | 4/2004 | Bedarida ................. G11C 16/08 365/185.13 |
| 2005/0078508 | A1 | 4/2005 | Chan et al. |
| 2007/0069710 | A1 * | 3/2007 | Lee ......................... G05F 3/242 323/313 |
| 2010/0014346 | A1 | 1/2010 | Lou et al. |
| 2010/0118590 | A1 | 5/2010 | Carter et al. |

OTHER PUBLICATIONS

Extended European Search Report for Patent Application No. 20156091.9, dated Jun. 29, 2020, 8 pages.

* cited by examiner

*Primary Examiner* — David Yi
*Assistant Examiner* — Alan Otto
(74) *Attorney, Agent, or Firm* — Compass IP Law PC

(57) ABSTRACT

A memory decoder enables the selection of a conductor of a row or column of a crosspoint array memory. The decoder includes a circuit to apply a bias voltage to select or deselect the conductor. The conductor can be either a wordline or a bitline. The decoder also includes a select device to selectively provide both high voltage bias and low voltage bias to the circuit to enable the circuit to apply the bias voltage. Thus, a single end device provides either rail to the bias circuit.

23 Claims, 14 Drawing Sheets

TABLE 360

| DESIGN | 362 POLARITY | 364 VOLTAGE SPLITTING | 366 SELECT DEVICE | 368 DESELECT DEVICE | 370 SEQUENCE GATES TO TOGGLE | 372 GLOBAL DEVICE COUNT | 374 N-TO-P LAYOUT RULES | 376 POLARITY TOGGLE ENERGY | 378 BIAS SUPPLIES |
|---|---|---|---|---|---|---|---|---|---|
| DECODER 330 | UNIPOLAR | YES | N,P | N,P | N/A | 1X | YES | N/A | VPP,VNN,0 |
| DECODER 340 | BIPOLAR | NO | N,P | N,P | YES | 2X | YES | $N*(VPP-VNN)^2$ | VPP,VNN,0 |
| DECODER 350 | BIPOLAR | YES | N,P | N,P | YES | 2X | YES | $N*(VPP-VNN)^2$ | VPP,VNN,0 |
| DECODER 410 | BIPOLAR | YES | N | P | YES | 1X | YES | $M*VNN^2$ | VPP,VNN,0 |
| DECODER 510 | BIPOLAR | YES | N | N | YES | 1X | NO | $M*VNN^2$ | VPP,VNN,0 |
| DECODER 610 | BIPOLAR | YES | HV-N | HV-P | NO | 1X | YES | ~0 | VPP,VNN,0 |
| DECODER 710 | BIPOLAR | YES | HV-N | HV-N | NO | 1X | NO | ~0 | VPP,VNN,0 |
| DECODER 810 | BIPOLAR | YES | HV-N | P | YES | 1X | YES | $VNN^2$ | VPP,VNN,0 |
| DECODER 910 | BIPOLAR | YES | HV-N | N | YES | 1X | NO | $VPP^2$ | VPP,VNN,0 |

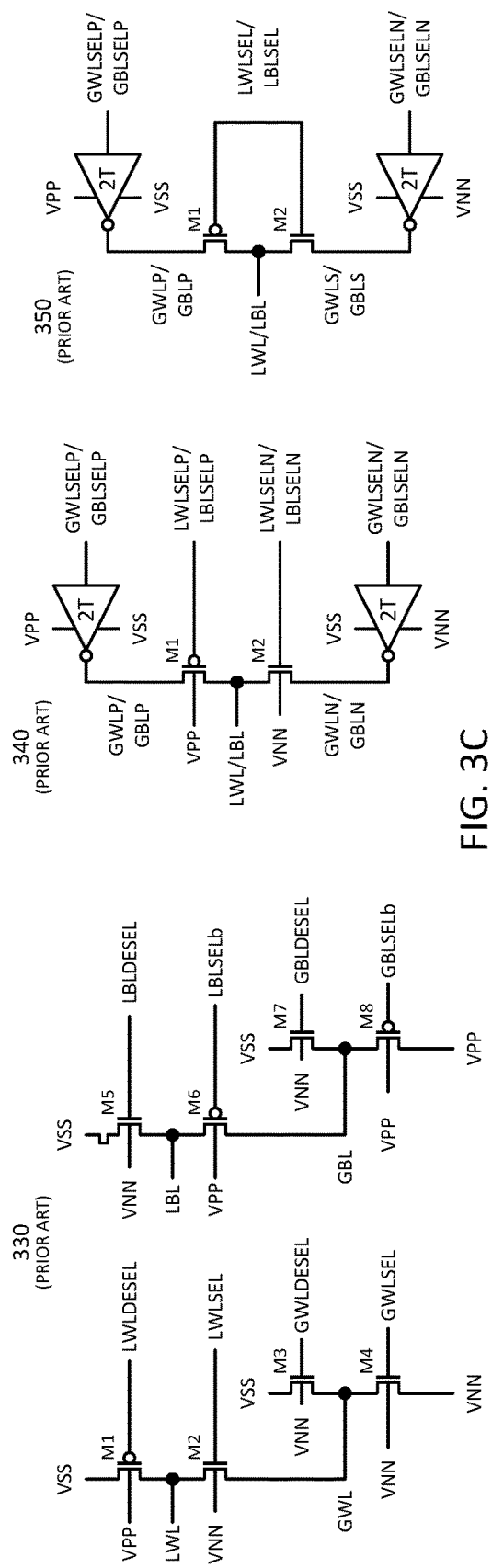

FIG. 3C

BIPOLAR DECODER FOR CROSSPOINT MEMORY CELLS

FIELD

Descriptions are generally related to memory devices, and more particular descriptions relate to a decoder for a memory array.

BACKGROUND

Memory devices include memory arrays to store data. The memory arrays include arrays of bitcells, where a single bitcell stores a bit (or multiple bits in a multilevel cell) of data. A memory device bitcell can be referred to as a memory cell. A memory device bitcell can be referred to as a storage cell. The memory arrays are often crosspoint arrays where a bitcell is formed at a crosspoint of a column and a row. Access to a specific bitcell is accomplished by addressing the bitcell by biasing rows and columns to target the specific bitcell.

The memory subsystem includes decoder circuits to connect to the array and access specific bitcells. Typically, rows are thought of as being on the x-axis, columns on the y-axis, and decks (or stacks of cells) on the z-axis. It will be understood that the z-axis is used for three-dimensional memory arrays, but not purely planar memory arrays. The decoder selectively connects the bitcells to other access circuitry, such as by switching connection lines on or off.

Traditional decoder circuits were unipolar, providing access to an access line by driving the desired line. In a unipolar design, for example, the x-axis would be biased with one polarity and the y-axis with the other polarity. Bipolar decoders can be more densely designed than multiple unipolar decoder circuits. A bipolar decoder for crosspoint memory cells traditionally includes two terminals that can be biased with positive (higher) or negative (lower) voltage potentials on either terminal. Thus, a bipolar design allows either terminal to be biased with either polarity of voltage potential.

Bipolar decoder architectures for crosspoint bitcells are functional but require double the number of transistors as unipolar designs, as they have extra global select transistors. Additionally, traditional bipolar decoder designs have a high energy impact in response to a polarity toggle event and have a large footprint due to the extra global select transistors, as well as design spacing rules for P-to-N transistor layouts. A polarity toggle event refers to an event where the polarity of a decoder terminal switches polarity, e.g., going from high to low or low to high. Bipolar decoders with polarity toggles traditionally have large transistors to withstand the energy at the gate, making the footprint larger and requiring increased energy to accomplish a polarity toggle. Design spacing rules refer to rules for separation of P-type transistors and N-type transistors. A P-type transistor refers to a transistor with a conductive channel (a P-channel) having holes as the dominant current carrier. An N-type transistor refers to a transistor with a conductive channel (an N-channel) having electrons as the dominant current carrier.

BRIEF DESCRIPTION OF THE DRAWINGS

The following description includes discussion of figures having illustrations given by way of example of an implementation. The drawings should be understood by way of example, and not by way of limitation. As used herein, references to one or more examples are to be understood as describing a particular feature, structure, or characteristic included in at least one implementation of the invention. Phrases such as "in one example" or "in an alternative example" appearing herein provide examples of implementations of the invention, and do not necessarily all refer to the same implementation. However, they are also not necessarily mutually exclusive.

FIG. 3C is a table representation of a comparison between traditional decoders and examples of decoders having an architecture as described herein.

Figure 1:
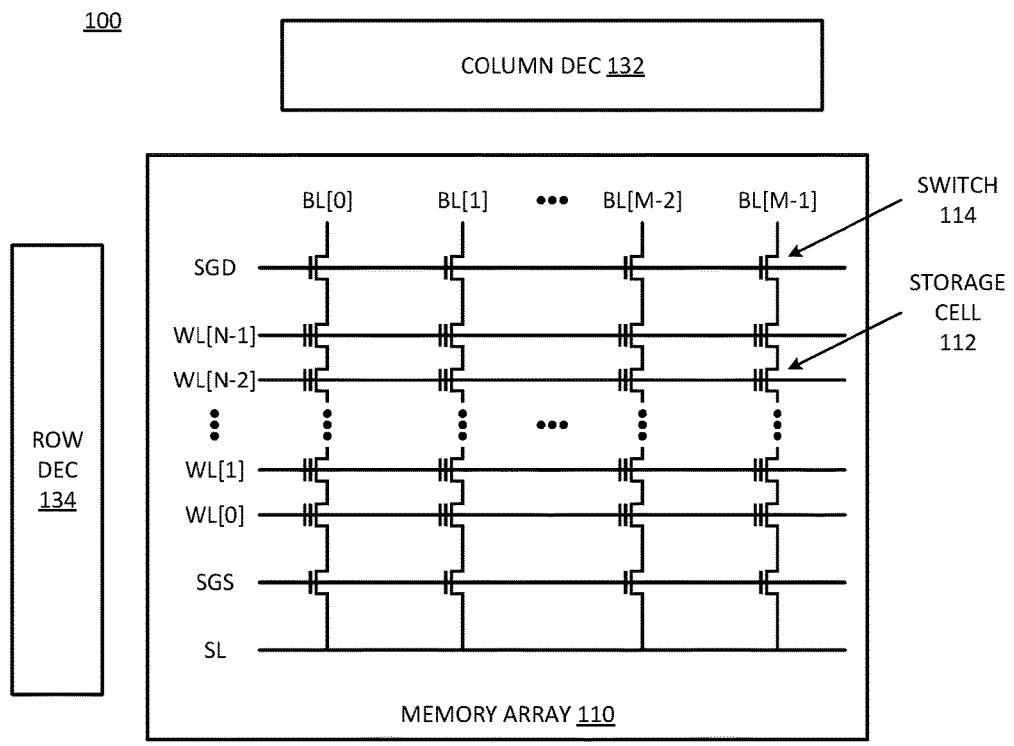
FIG. 1 is a block diagram of an example of a memory array with a decoder that has a device to provide both high voltage bias and low voltage bias.

Descriptions of certain details and implementations follow, including non-limiting descriptions of the figures, which may depict some or all examples, and well as other potential implementations.

DETAILED DESCRIPTION

As described herein, a memory decoder enables the selection of a conductor of a row or column or pillar of a crosspoint array memory. The decoder includes a circuit to apply a bias voltage to select or deselect the conductor. The conductor can be either a wordline or a bitline or a channel. A wordline refers to a wordline conductor that is charged in response to a wordline address or row address and is often considered the x-axis conductor. A bitline refers to a bitline conductor that is charged in response to a bitline address or column address. A channel refers to a channel conductor for three-dimensional (3D) memory arrays. In a 3D structure, the architecture of wordline and bitline may be different than in a traditional planar memory structure. A channel can be referred to as a pillar and may be charged by a decoder in response to a bitline address, for example, by the decoder charging the bitline which connects to the pillar. Thus, a crosspoint array can refer to an array of overlapping and crisscrossing conductive lines to charge or bias memory cells.

The memory cells can be part of a memory array for a dynamic random access memory (DRAM) device, a not AND (NAND) memory device, a nor OR (NOR) memory device, a byte addressable nonvolatile memory such as a device made from chalcogenide glass, a resistive memory where bitcells store data based on a resistive state of the memory cell, or other memory device. The memory array can be part of system memory, device storage, or other use of memory.

The decoder includes a select device to selectively provide both high voltage bias and low voltage bias to the circuit to enable the circuit to apply the bias voltage to a bitcell. Thus, a single end device provides either rail to the bias circuit. The bias circuit provides a voltage to charge the line to select a row or column, for example, in which a target bitcell is found. When both row and column decoders apply voltages to selected lines, a target bitcell at the intersection of the selected row and selected column can be accessed.

In one example, the decoder is bipolar, capable of being charged with a higher or lower voltage potential at either of two terminals. The higher voltage can refer to a positive voltage rail. The lower voltage can refer to a low or negative voltage rail. In one example, intermediate higher voltages can be provided, which can be in between the low voltage rail and the high voltage rail. The bipolar decoding enables bipolar cell biasing and selection.

As described herein, a bipolar decoder has fewer circuit elements as compared to traditional bipolar decoders, which provides for a more compact decoder. A more compact decoder as described can still perform the selection functions, and has lower energy consumption and a smaller footprint relative to traditional devices. A bipolar decoder provides the ability to flip polarity, which traditionally puts stress on the circuit. There are certain decoding algorithms that work better using certain polarity over other polarity, which means that the ability to flip polarity can enable preferred operation in certain decoding algorithms. Additionally, certain bitcells respond better to one polarity or another, depending on the architecture of the bitcell. Having a single decoder design to use with bitcells of different architecture can save costs associated with design and implementation. A smaller decoder not only saves circuit area or footprint, but can reduce the amount of energy used when flipping polarity, or lower switching energy.

As described herein, a bipolar decoder can reduce the amount of energy used in toggling between positive polarity and negative polarity. Thus, when the decoder switches from driving the conductive line (either bitline or wordline) to negative polarity from positive polarity, or switching from driving the conductive line to positive polarity from negative polarity, the driver can use less energy for the toggle than traditional designs. Traditional decoders switch the gate voltage between positive and negative voltage rails on the select devices to increase reliability of the devices and ensure a proper transition between positive and negative polarities. As described herein, the selector designs do not require switching the gate voltage between voltage rail extremes (i.e., between the high voltage rail and low voltage rail). In one example, a decoder controller can switch the decoder gate voltages between a mid voltage rail or mid voltage reference. In one example, a decoder controller does not need to switch the gate voltages at all, but simply has the decoder switch polarity without needing to switch gate voltage.

Reference to reduced area or saving footprint refers to the fact that the decoder designs described herein are smaller in size than traditional decoders. Traditional decoders include inverter circuits on both the positive bias and the negative bias paths of the decoder. As described herein, both high voltage bias and low voltage bias is received via the same path, through the same select device. As such, at least one selection path can be eliminated relative to traditional designs, which results in fewer select circuit components being used in the design. Additionally, the decoder designs use reduced gate to drain/source voltage potentials and can operate at lower currents. The lower currents result in devices that are physically smaller than corresponding devices for traditional decoders. Thus, the decoder designs can provide more compact designs through the use of fewer devices. The decoder designs can also provide more compact designs through the use of transistor devices that are smaller relative to traditional decoders.

In one example, the number of local devices or local elements in the bipolar decoder is the same as a traditional bipolar transistor. A traditional bipolar transistor includes separate inverters for global selection on the two global terminals. Reference to "global" and "local" refers to different levels of selection architecture. In large bitcell arrays, the bitcells are typically subdivided with different selection lines to reduce the amount of conductor that needs to be charged to access a specific bitcell. Thus, there is a tradeoff or balance between increased levels of selection abstraction and energy use. More selection architecture can increase the complexity and signaling lines, while enabling the charging of smaller portions of the array. There can be any number of global selection levels, and a specific architecture is not specified herein. For each level of abstraction different decoders are typically used. The decoders herein can be applied for the selection between more global and more local selection conductor lines. For purposes of simplicity, the accompanying drawings and the descriptions below refer to a global selection level and a local selection level. It will be understood that additional global selection can be provided as is understood in the art. It will be understood that the same decoder design can be used for row selection as for column selection. Thus, reference is made to a conductor, which can be for a wordline or a bitline.

FIG. 1 is a block diagram of an example of a memory array with a decoder that has a device to provide both high voltage bias and low voltage bias. System 100 represents a memory array with a decoder in accordance with any description herein. System 100 can be or be included in a 3D crosspoint (3DXP) array such as a byte addressable non-volatile storage, a volatile memory array, a solid state drive (SSD), or other memory or storage that uses decoders to access crosspoint bitcells. System 100 can be integrated into a computing device.

System 100 includes memory array 110. In one example, memory array 110 represents a 3D NAND storage device. In one example, memory array 110 represents a 3D stacked memory device. In one example, the storage cells 112 represent NAND storage cells. In one example, storage cells 112 represent NOR-based storage cells.

Memory array 110 includes N wordlines (WL[0] to WL[N−1]). Memory array 110 includes M bitlines (BL[0] to BL[M−1]). In one example, each storage cell 112 within memory array 110 is addressed or selected by asserting a wordline and a bitline, in conjunction with enabling the column with the gate select switches 114 (shown only on SGD, but SGS switches can be considered included in the control). In system 100, the wordlines are labeled as "WL" and the bitlines as "BL". SGD refers to a select gate drain, which controls connection of a bitline to a column of storage cells 112. SGS refers to a select gate source, which controls connection of a column of storage cells 112 to a source line (SL) or source conductor. The SGD and SGS signals can control the switching and timing of access of the various storage cells 112.

Memory array 110 can include additional architecture than what is illustrated, for example, separation in subblocks or other groups or divisions of cells 112. A subblock can refer to the columns, pillars, or strings of storage cells 112 that are accessed together. The pillars can be accessed to together by responding to a common switching signal. The switching signal can refer to gating control for the pillar. For example, various pillars can be controlled by select gate drain (SGD) signal lines and select gate source (SGS) signal lines. An SGD signal line selectively couples a column to a bitline (BL). An SGS signal line selectively couples a column to a source line (SL). The source line (SL) can be a source layer of material integrated onto a semiconductor substrate.

System 100 includes column decode circuitry (column dec) 132 as a column address decoder to determine from a received command which bitline or bitlines to assert for a particular command. Row decode circuitry (row dec) 134 represents a row address decoder to determine from a received command which wordline or wordlines to assert for the command. It will be understood that column decoder 132 and row decoder 134 can represent many separately controllable switching devices. For example, each BL can include a separate decoder circuit to control access to the bitline. Similarly, each WL can include a separate decoder circuit to control access to the wordline.

The decoder circuits 132 and 134 selectively couple voltage supply levels from one or more voltage supply devices of system 100, which are not specifically shown. The voltage supply or voltage supplies can include one or more voltage sources or voltage levels generated within system 100 to power electronic components of an electronic device, which can include system 100.

System 100 includes decode circuitry to apply different voltage levels to different conductors of memory array 110. In one example, column decode 132 and row decode 134 provide circuitry to apply the various voltages to the various columns and rows of memory array 110. In one example, row decode 134 also applies voltage levels to the select lines (e.g., SGS, SGD) for access to the storage cells. It will be understood that SGD and SGS control circuitry are not necessarily included in every implementation of system 100, and are shown simply for example. For example, the SGD and SGS signals could be used in a 3D memory and not in a planar memory. The selective application of voltages through the decoders selectively deselects or selects conductor lines to selectively prevent storage cell access or enable storage cell access, respectively.

Figure 2:
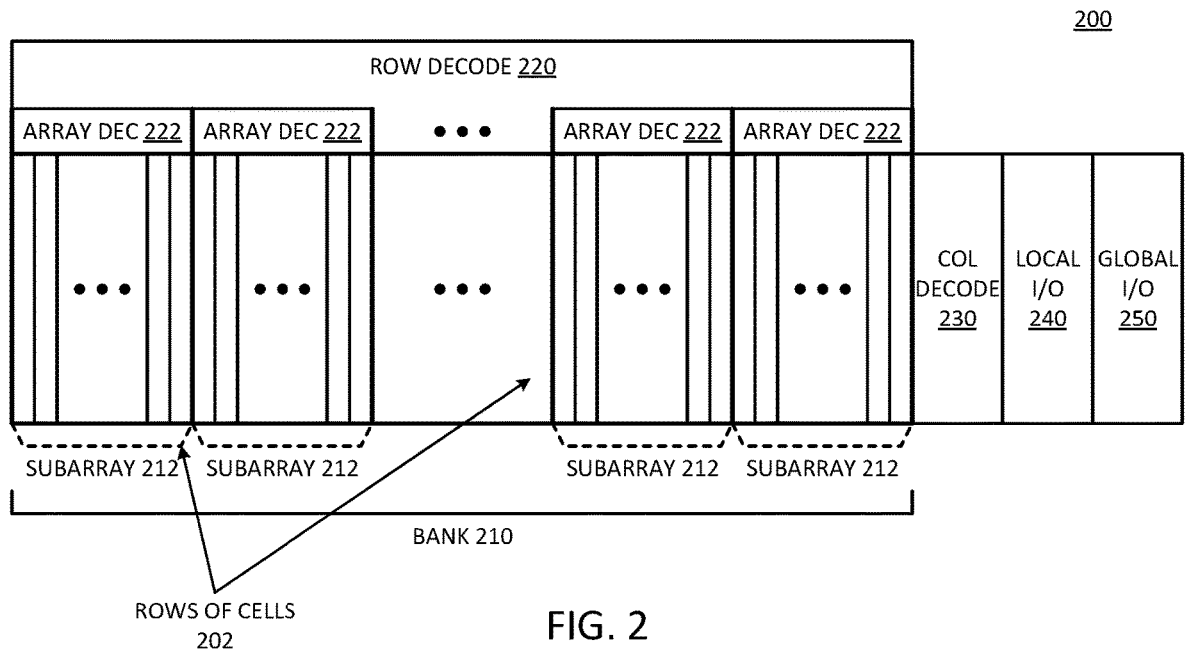
FIG. 2 is a block diagram of an example of a memory architecture subdivided into arrays with a decoder that has a device to provide both high voltage bias and low voltage bias.

FIG. 2 is a block diagram of an example of a memory architecture subdivided into arrays with a decoder that has a device to provide both high voltage bias and low voltage bias. Memory 200 illustrates components of a memory device with a specific mapping of I/O to portions of the memory array, in accordance with any example described herein. System 200 selectively connects the I/O to specific cells with decoder circuitry that can be in accordance with any example of a decoder herein. Memory 200 provides an example of a memory device in accordance with system 100.

Memory 200 includes bank 210, which includes multiple rows of cells 202. The vertical rectangles of the diagram represent the rows. In one example, bank 210 is organized as multiple subarrays 212. Subarray 212 or an array can refer to a group of rows 202. An access command (either a Read command or a Write command) triggers command signal lines that are interpreted by row decode logic 220 to select a row or rows for the operation. In one example, row decode logic 220 includes subarray or array decode logic 222 to select a specific subarray 212 of bank 210. Array decode logic 222 can represent another level of decoding logic, which can be in addition to row decode 220 or can simply be a specific type of row decode 220. Memory 200 includes column decode logic 230 to select a column of data, where signal lines from specific subarrays can be output to sense amplifiers and routed with local I/O (input/output) 240 to global I/O 250. Local I/O 240 refers to the routing circuitry to transfer data of specific subarrays 212. Global I/O 250 refers to the routing circuitry that couples the local I/O to the external I/O connectors of memory 200. In one example, local I/O 240 includes logic to map specific signal lines from subarrays 212 to specific I/O paths or data paths that connect to specific global I/O connectors.

Figure 3A:
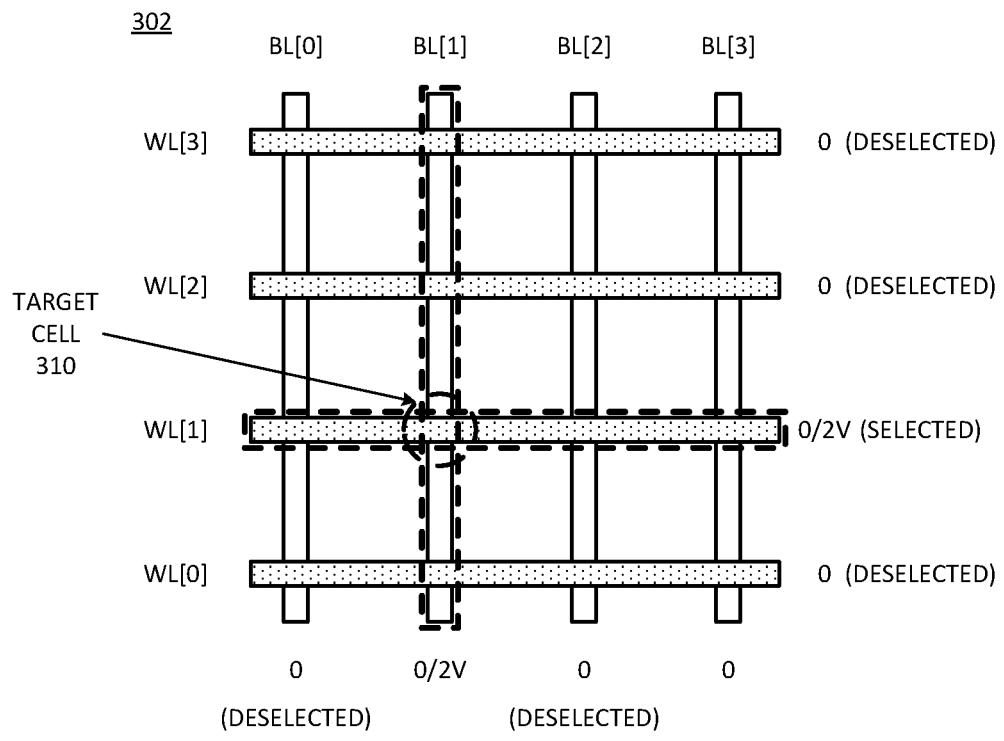
FIG. 3A is a block diagrams of an example of selection of a target memory cell with an architecture that does not use voltage splitting.

FIG. 3A is a block diagrams of an example of selection of a target memory cell with an architecture that does not use voltage splitting. Array 302 represents a portion of a memory array, such as memory array 110 of system 100. Array 302 illustrates target cell 310, which is accessed by selecting BL[1] and WL[1]. Array 302 is supported by decoders (not specifically shown) that provide the voltage biases illustrated. The decoders need to support switching between the rails (0 and 2V as illustrated). It will be understood that array 302 will include decoders for the bitlines BL[0]:BL[3], as well as decoders for the wordline WL[0]:WL[3].

For array 302, the decoders having an architecture that does not use voltage splitting. In a non-voltage splitting architecture, the deselected wordlines and deselected bitlines can be set to 0V. The selected wordline (WL[1]) and the selected bitline (BL[1]) can be toggled between 0V and 2V.

Figure 3B:
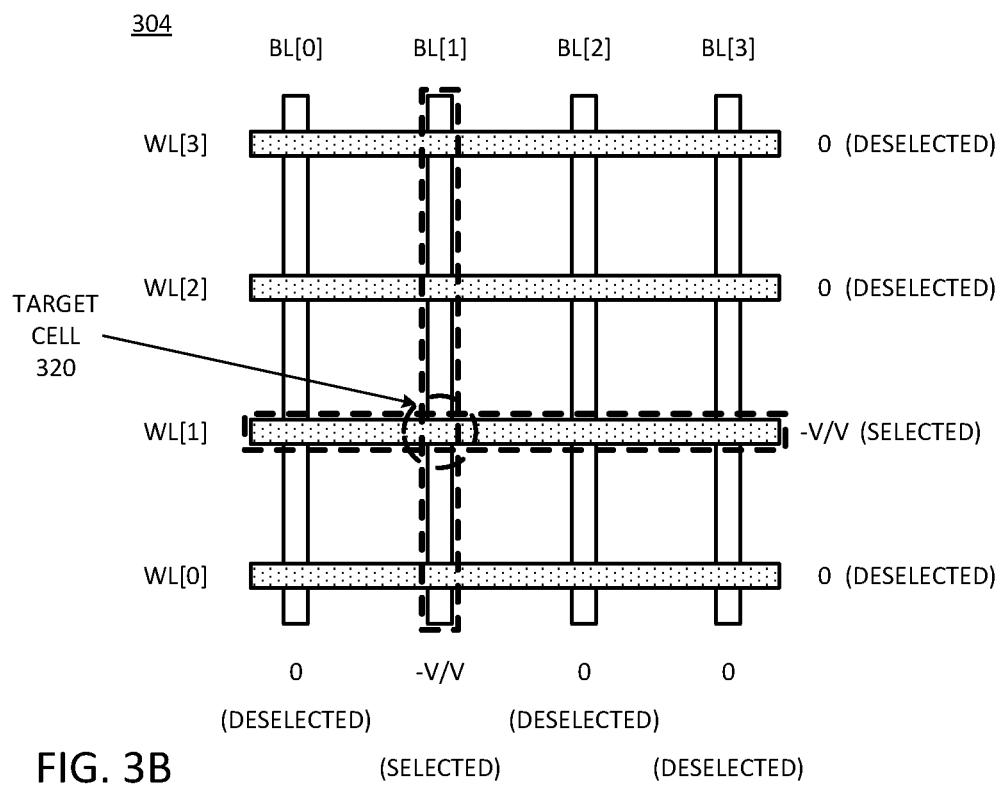
FIG. 3B is a block diagrams of an example of selection of a target memory cell with a voltage splitting architecture.

FIG. 3B is a block diagrams of an example of selection of a target memory cell with a voltage splitting architecture. Array 304 represents a portion of a memory array, such as memory array 110 of system 100. Array 304 illustrates target cell 320, which is accessed by selecting BL[1] and WL[1]. Array 304 is supported by decoders (not specifically shown) that provide the voltage biases illustrated. The decoders can be in accordance with any example provided herein. It will be understood that array 304 will include decoders for the bitlines BL[0]:BL[3], as well as decoders for the wordline WL[0]:WL[3].

For array 304, the decoders having an architecture that uses voltage splitting. In a voltage splitting architecture, deselected wordlines and deselected bitlines can be set to 0V, which is a local midline reference voltage. For example, with 0V and 2V rails, the "zero" voltage in array 304 can actually be 1V as an absolute value, but is a reference voltage in the local circuit. The selected wordline (WL[1]) and the selected bitline (BL[1]) can be toggled between −V and +V, where −V and +V represent positive and negative voltage steps below and above, respectively, the 0V reference.

FIG. 3C is a table representation of a comparison between traditional decoders and examples of decoders having an architecture as described herein. Table 360 compares features of various decoder circuits. Throughout the description, VPP refers to a high positive bias voltage, and VNN refers to a high negative bias. The high positive and high negative is made in reference to a midrange voltage. For voltage splitting architectures, VPP is typically +V and VNN is typically −V, while the midrange or VSS voltage is 0V. For a non-voltage splitting architecture, +2V typically needs to be supplied, with VPP being +2V, VSS being +V, and VNN being 0V.

Decoder 330 represents a traditional unipolar circuit. The decoder selectively provides a low voltage (VNN) on a global wordline (GWL) to selectively drive a local wordline (LWL) low (to VNN). In response to GWLDESEL, M3 connects GWL to VSS. In response to GWLSEL, M4 connects GWL to VNN. M1 represents a P-type transistor to drive the conductor to VSS to deselect LWL in response to LWLDESEL. M2 represents an N-type transistor to drive the conductor to GWL to select LWL in response to LWLSEL and the GWL state. For the bitline, decoder 330 selectively provides a high voltage (VSS) on a global bitline (GBL) to selectively drive a local bitline (LBL) high (to VPP). In response to GBLDESEL, M7 connects GBL to VSS, which can be referred to as a midline voltage. In response to GBLSEL, M8 connects GBL to VPP. M5 represents an N-type transistor to drive the conductor to VSS to deselect LBL in response to LBLDESEL. M6 represents a P-type transistor to drive the conductor to GBL to select LBL in response to LBLSEL and the GBL state.

Decoder 340 represents a traditional bipolar circuit that does not use voltage splitting. The decoder has separate high voltage (VPP) and low voltage (VNN) legs. More specifically, traditional bipolar decoders have inverters to selectively provide VPP to the LWL/LBL via M1, which represents a P-type transistor to drive the conductor to VSS or VPP. VSS can deselect a line or conductor, and VPP can select the line, depending on the selection algorithm. Decoder 340 includes a separate inverter leg to selectively provide VNN to the LWL/LBL via M2, which represents an N-type transistor to drive the conductor to VSS or VNN. VNN can select the line, depending on the selection algorithm. As illustrated, the inverters include at least two transistors each ("2T").

Decoder 350 represents a traditional bipolar circuit that uses voltage splitting. Decoder 350 can be considered very similar to decoder 340, but selecting between 0V and −V/+V. For the sake of simplicity, the signals are labeled the same as for decoder 340, although in a practical implementation there may be different signals that would be used to supply the voltages for decoder 350 than would be used for decoder 340. The local WL or BL selection signals can be tied together in decoder 350. The operation of decoder 350 is essentially the same as described for decoder 340, with the understanding that VSS would be a midrange voltage of 0V instead of +V. Like decoder 340, decode 350 includes separate 2T inverter legs to provide VPP or VNN to the LWL/LBL.

Table 360 provides a comparison of the three decoders of FIG. 3C with those that follow in FIGS. 4-9. Table 360 compares the decoder designs based on polarity (column 362), voltage splitting architecture (column 364), select device type (column 366), deselect device type (column 368), whether it sequences gate to toggle (column 370), the global device count (column 372), whether N-to-P layout rules apply (column 374), and polarity toggle energy (column 376). For purposes of Table 360, all designs are anticipated to receive bias supplies of VPP, VNN, and 0 (or VSS), as per column 378.

Referring to column 362, decoder 330 is a unipolar design, and decoders 340, 350, 410, 510, 610, 710, 810, and 910 are bipolar. Decoders 340 and 350 are traditional bipolar decoders, while the other bipolar decoders provide high and low voltage through a common device.

Referring to column 364, decoder 340 does not use a voltage splitting architecture, while all other decoders use a voltage splitting architecture.

Referring to column 366, the select devices of traditional decoders 330, 340, and 350 are N and P. The designs provided herein limit the select devices to only N. More specifically, decoders 410 and 510 include regular N-type select devices, while decoders 610, 710, 810, and 910 have high-voltage (HV) N-type select devices.

Referring to column 368, the deselect devices of traditional decoders 330, 340, and 350 are N and P. The designs provided herein limit the deselect devices to either only P-type or only N-type. More specifically, decoders 410 and 810 include regular P-type deselect devices. Decoders 510 and 910 include regular N-type deselect devices. Circuit 610 includes a high voltage P-type deselect device. Circuit 710 includes a high voltage N-type deselect device.

A high voltage select device or a high voltage deselect device includes a high voltage transistor. The transistor has a conductive channel that forms in response to a gate voltage. A higher voltage on the gate creates a wider channel. A higher voltage can cause migration of carriers into the gate insulator or gate oxide, which can create an unwanted conductive path through the gate insulator. A high voltage transistor refers to a transistor that can tolerate a rail-to-rail voltage differential between the gate in a regular operating mode of the transistor. A high voltage transistor has a lower likelihood of creation of a conductive path through the insulator when a rail-to-rail voltage differential occurs across the transistor. Thus, a high voltage transistor remains reliable even when a regular operating mode involves a gate to source or gate to drain rail to rail voltage differential.

Referring to column 370, decoder 330 includes separate decoders for P and N legs, and so the sequencing of gates to toggle polarity is not applicable (N/A), because different gates are used. Traditional decoders 340 and 350 will sequence the gates for polarity toggle to avoid the high voltage stresses across the gates. Decoders 410, 510, 810, and 910 also sequence the gates for polarity toggle. Decoders 610 and 710 have high voltage select and deselect devices, which obviates the need to sequence the gates for a polarity toggle.

Referring to column 372, traditional unipolar decoder 330 includes a relative number of transistors or global device count of 1×. However, the unipolar decoder requires separate P and N devices. Traditional bipolar decoders 340 and 350 are bipolar, but require 2× the number of global selection devices relative to the unipolar design. All decoders 410, 510, 610, 710, 810, and 910 provided herein have only 1X the number of global selection devices by providing the high and low voltage through a common local selection device, or only through one leg of the local line driver circuit.

Referring to column 374, new decoders 510, 710, and 910 are designed with only N-type transistors. Thus, there are no N-to-P layout rule that impact the decoder area. The traditional designs of decoders 330, 340, and 350, and new designs 410, 610, and 810 include by N-type and P-type devices, which requires N-to-P layout rules that impact the decoder area.

Referring to column 376, traditional unipolar decoder 330 is not bipolar, and cannot switch polarity, which means there is no proportionality factor for polarity toggle energy. Traditional decoders 340 and 350 have a proportionality factor of $N*(VPP-VNN)^2$ for polarity toggle energy. For such a proportionality factor, N refers to the number of deselected local lines per selected local lines in the array, which is typically >>1. It will be observed that decoders 410 and 510 have a lower proportionality factor of $M*VNN^2$. M refers to the number of deselected global lines per selected global lines in the array, which is typically >>1, and is typically smaller than N. However, this proportionality factor will typically be smaller than that for decoders 340 and 350, because typically (VPP−VNN)>VNN. Decoders 810 and 910 have even lower proportionality factors of $VNN^2$ and $VPP^2$, respectively. Decoders 610 and 710 have proportionality factors of approximately 0.

For decoders 340 and 350, both have high energy impact from a polarity toggle event due to the deselected decoder gates toggling. Thus, N deselected decoder gates will toggle for every selected decoder gate. For decoders 410 and 510, the energy occurs due to the global device gates rather than the local device gates. For decoders 810 and 910, the energy is only for a small switching step for one local device and one global device, making a smaller toggle sequence, and the energy impact is minimized. For decoders 610 and 710, there is no toggle sequence because the voltage can simply be changed due to high voltage gates on the transistors, effectively eliminating the proportionality factor.

In general, the decoders are bipolar decoders having a reduced component count relative to traditional decoders having inverters on both terminals (so more transistors). The decoders provide current from only one direction rather than from different terminals. Thus, applying both negative and positive biases through the same selector end device.

The decoders without inverters can reduce the component count and therefore reduce the footprint size. In one example, the decoders reduce the energy transitions by using higher voltage devices (e.g., one or more high voltage MOSFETs (metal oxide semiconductor field effect transistors). Such high voltage devices can reduce the energy usage and improve the power consumption. The energy reduction comes from reducing the amount of toggling, because only gates needed to implement the access need to be toggled. With high voltage transistors or components that can handle voltage swings from one rail to another, the gates do not need to be switched. In one example, the decoders are implemented with only N-type devices and not P-type devices. Such a design can provide design rule advantages because there are no P to N junctions. It will be understood that the following designs can provide certain advantages for different scenarios.

The decoders described below as decoder 410, decoder 510, decoder 610, decoder 710, decoder 810, and decoder 910 illustrate select devices for selection and driving a global portion of a conductive line, and select devices for selection and driving a local portion of a conductive line.

The expression "global" and "local" can be understood as relative to each other, where a global line connects multiple sub-portions of devices driven by a given line and the local line connects multiple devices. Thus, global lines couple to local lines and local lines couple to devices. However, it will be understood that more layers or hierarchy of architecture could be used where a local line for one decoder is the global line for a decoder of a sub-portion driven by the local line. In general, the devices can be referred to in a decoder as global select devices and local select devices. For convenience in distinguishing the devices, they may also be referred to herein as a driver circuit for the select devices that drive the local line, and select devices for the global selectors. It will be understood that such language and descriptions is merely for convenience in description and is not limiting. Both the global and local selectors can be referred to as selectors or select devices, or could be referred to as driver circuits, or some other combination of these terms.

Figure 4:
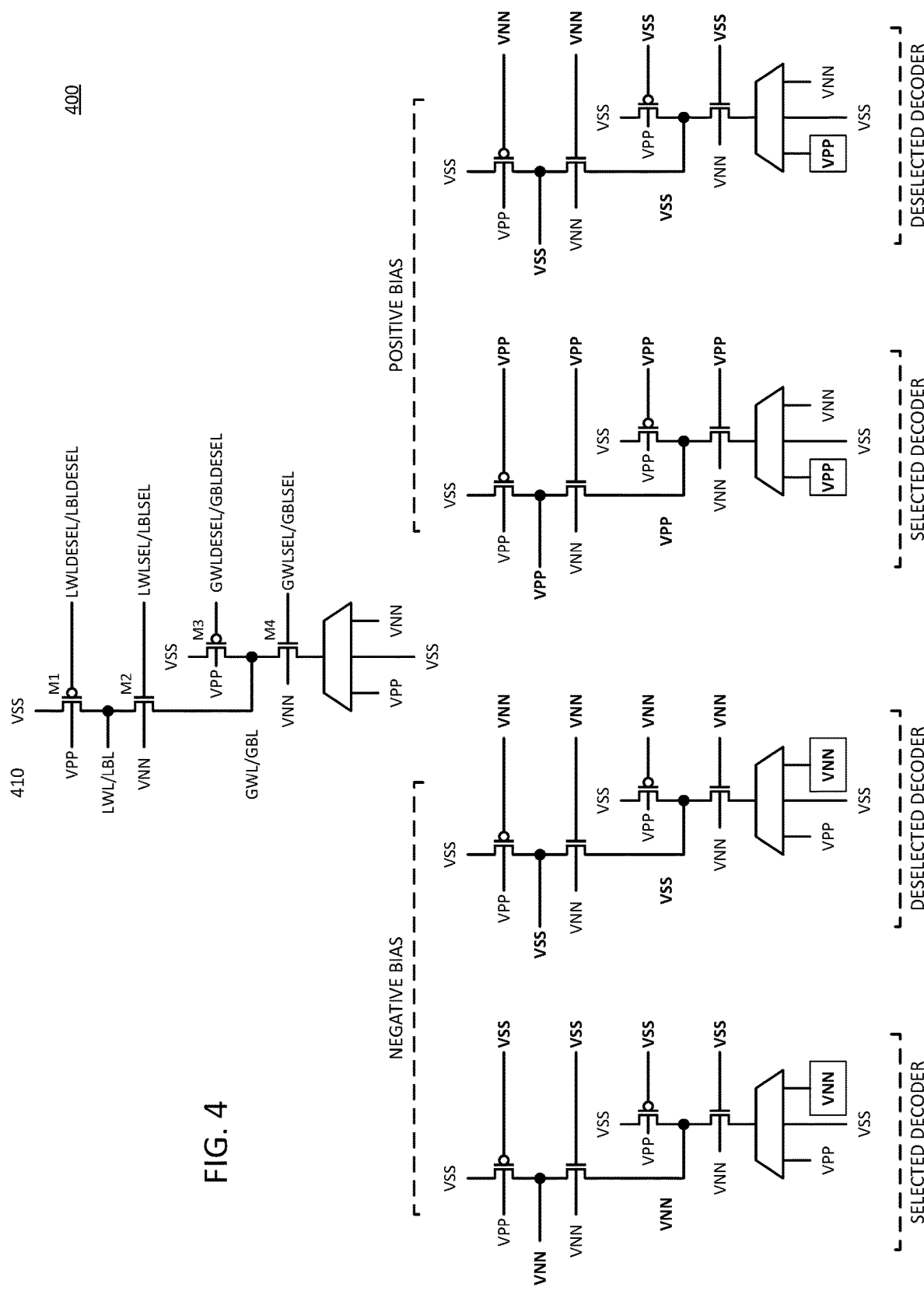
FIG. 4 is a diagram of an example of a bipolar complementary decoder with a select device to provide either high voltage bias or low voltage bias.

FIG. 4 is a diagram of an example of a bipolar complementary decoder with a select device to provide either high voltage bias or low voltage bias. Decoder 410 provides an example of a decoder in accordance with any decoder of system 100 or system 200. Diagram 400 illustrates a representation of the decoder design itself (decoder 410), as well as a representation of a negative bias condition and a representation of a positive bias condition for the decoder. Decoder 410 is specifically labeled with transistor numbers, which are to be understood as applying to the various additional diagrams for negative and positive bias, with selected and deselected decoders for each.

M1 represents a P-type transistor and M2 represents an N-type transistor. Together M1 and M2 provide a driver or selector for an LWL or LBL. The local wordline or bitline forms part of a crosspoint array of conductors. The crosspoint array provides crosspoints where a memory cell is formed. The conductor is labeled as LWL or LBL to represent the fact that the same decoder can be used for column decode operation or for row decode operation, or for both row decode and column decode. It will be understood that separate decoder devices will be used for row and column decoders, but the same decoder design can apply to either column or row decoders. M1 and M2 represent selectors for the local line.

In one example, M1 is driven by the local deselect signal (LWLDESEL or LBLDESEL). In one example, M2 is driven by the local select signal (LWLSEL or LBLSEL). Deselection will drive the LWL/LBL to VSS through M1. Selection will drive the LWL/LBL to the bias of the GWL/GBL through M2.

Decoder 410 includes transistors M3 and M4 for global selection, and can be referred to as global selectors or global select devices. M3 represents a P-type transistor and M4 represents an N-type transistor. In one example, M3 is driven by the global deselect signal (GWLDESEL/GBLDESEL). Deselection will drive GWL/GBL to VSS. M4 is driven by the global select signal (GWLSEL/GBLSEL). Selection will drive GWL/GBL to the output of the multiplexer (mux). The multiplexer can provide VPP, VSS, or VNN. The selection of the output of the mux is not specifically illustrated. The mux selection can be controlled in combination with selection/deselection signals to drive the appropriate voltage level to the global line.

The circuit of M1 and M2 can apply a bias voltage to the local line. The circuit of M3 and M4 can provide a select device to selectively provide both high voltage bias and low voltage bias to the circuit of M1 and M2. From one perspective, the mux can be part of the select device.

In one example of decoder 410, both the circuit to apply the bias to the local conductor line and the selector circuit are implemented as complementary metal oxide semiconductor (CMOS) drivers, with both P-type and N-type transistors. As illustrated, the driver of M1 and M2 interfaces with the local wordline or bitline. As illustrated, the driver of M3 and M4 interfaces with the global wordline or bitline.

In one example of a negative bias scenario, the mux is selected to provide VNN. In one example of the negative bias scenario for a selected decoder, the local select and local deselect signals are driven to VSS. The global select and deselect signals are also driven to VSS. VSS on M3 and M4 causes the global selector to drive VNN from the mux to GWL/GBL. VSS on M1 and M2 causes the circuit to drive LWL/LBL to GWL/GBL.

In one example of the negative bias scenario fora deselected decoder, the local select and local deselect signals are driven to VNN. The global select and deselect signals are also driven to VNN. VNN on M3 and M4 causes the selector to drive VSS to GWL/GBL. VNN on M1 and M2 causes the circuit to drive LWL/LBL to VSS.

In one example of a positive bias scenario, the mux is selected to provide VPP. In one example of the positive bias scenario for a selected decoder, the local select and local deselect signals are driven to VPP. The global select and deselect signals are also driven to VPP. VPP on M3 and M4 causes the global selector to drive VPP from the mux to GWL/GBL. VPP on M1 and M2 causes the circuit to drive LWL/LBL to GWL/GBL.

In one example of the positive bias scenario for a deselected decoder, the local select and local deselect signals are driven to VNN. The global select and deselect signals are also driven to VSS. VSS on M3 and M4 causes the selector to drive VSS to GWL/GBL. VNN on M1 and M2 causes the circuit to drive LWL/LBL to VSS.

For decoder 410, there is no need for a high voltage transistor because the highest gate differentials are only VNN to VSS, except the VPP to VNN on the positive bias selected decoder. The polarity toggle sequence for decoder 410 can be as follows for negative to positive polarity: 1) the mux output is set to VSS; 2) switching VNN on M3 and M4 of the deselected decoder to VSS; 3) switching VSS on M1 and M2 of the selected decoder to VPP on M1 and M2; 4) switching VSS on M3 and M4 of the selected decoder to VPP; and, 5) the mux output is set to VPP. The polarity toggle sequence for decoder 410 can be as follows for positive to negative polarity: 1) the mux output is set to VSS; 2) switching VSS on M3 and M4 of the deselected decoder to VNN; 3) switching VPP on M1 and M2 of the selected decoder to VSS on M1 and M2; 4) switching VPP on M3 and M4 of the selected decoder to VSS; and, 5) the mux output is set VNN. It will be observed that rather than switching the gate voltages directly from positive to negative or negative to positive, the toggle sequence first transitions to an intermediate voltage.

Figure 5:
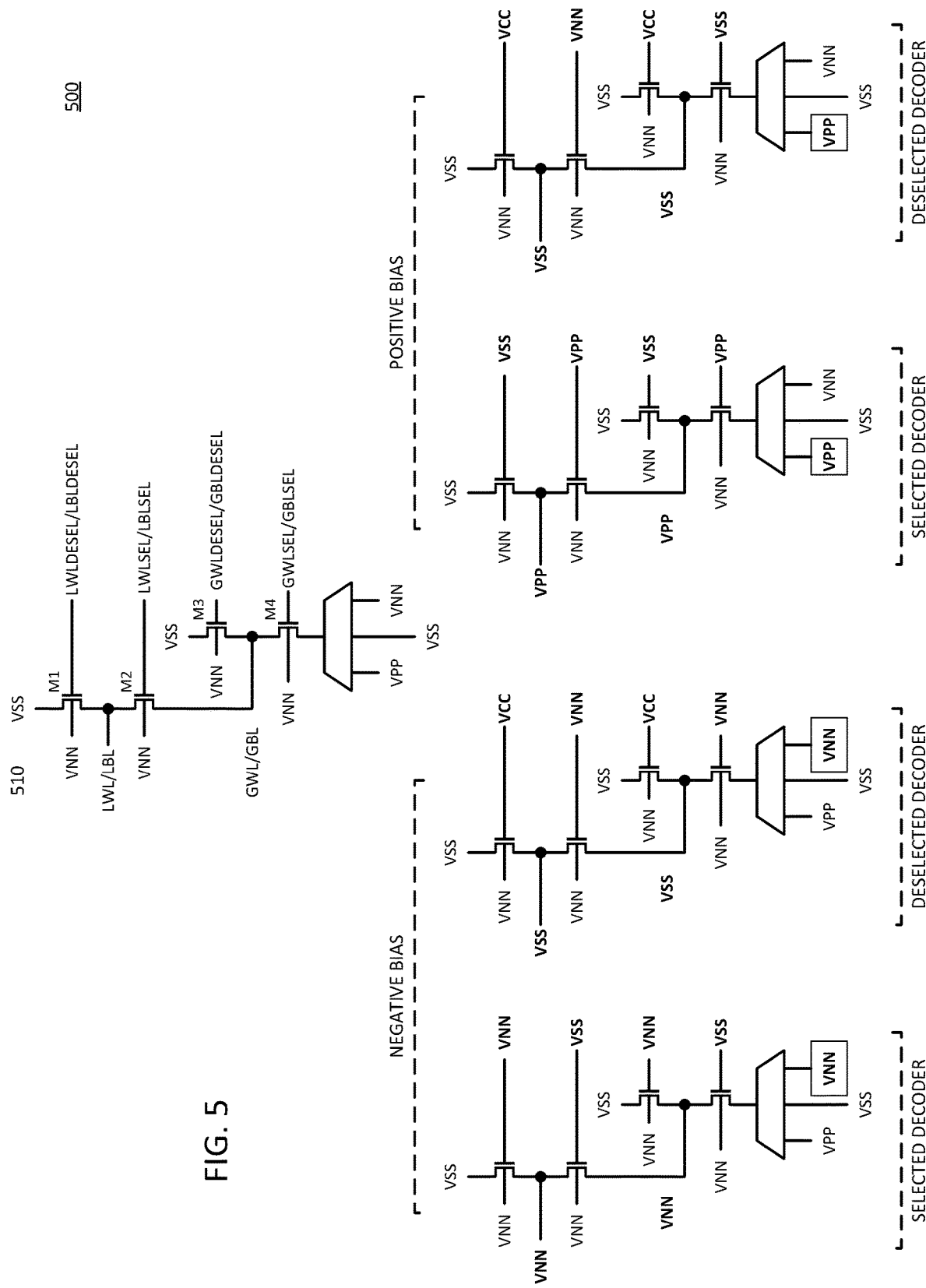
FIG. 5 is a diagram of an example of a bipolar decoder with a select device to provide either high voltage bias or low voltage bias.

FIG. 5 is a diagram of an example of a bipolar decoder with a select device to provide either high voltage bias or low voltage bias. Decoder 510 provides an example of a decoder in accordance with any decoder of system 100 or system 200. Diagram 500 illustrates a representation of the decoder design itself (decoder 510), as well as a representation of a negative bias condition and a representation of a positive bias condition for the decoder. Decoder 510 is specifically labeled with transistor numbers, which are to be understood as applying to the various additional diagrams for negative and positive bias, with selected and deselected decoders for each.

M1 and M2 both represent N-type transistors. Together M1 and M2 provide a driver or selector for an LWL or LBL. The local wordline or bitline forms part of a crosspoint array of conductors. The conductor is labeled as LWL or LBL to represent the fact that the same decoder can be used for column decode operation or for row decode operation, or for both row decode and column decode. It will be understood that separate decoder devices will be used for row and column decoders, but the same decoder design can apply to either column or row decoders. M1 and M2 represent selectors for the local line.

In one example, M1 is driven by the local deselect signal (LWLDESEL or LBLDESEL). In one example, M2 is driven by the local select signal (LWLSEL or LBLSEL). Deselection will drive the LWL/LBL to VSS through M1. Selection will drive the LWL/LBL to the bias of the GWL/GBL through M2.

Decoder 510 includes transistors M3 and M4 for global selection, and can be referred to as global selectors or global select devices. M3 and M4 represent N-type transistors. Thus, decoder 510 represents a decoder with only N-type metal oxide semiconductor (NMOS) devices. In one example, M3 is driven by the global deselect signal (GWLDESEL/GBLDESEL). Deselection will drive GWL/GBL to VSS. M4 is driven by the global select signal (GWLSEL/GBLSEL). Selection will drive GWL/GBL to the output of the mux, which can provide VPP, VSS, or VNN. The mux selection can be controlled in combination with selection/deselection signals to drive the appropriate voltage level to the global line.

The circuit of M1 and M2 can apply a bias voltage to the local line. The circuit of M3 and M4 can provide a select device to selectively provide both high voltage bias and low voltage bias to the circuit of M1 and M2. From one perspective, the mux can be part of the select device. As illustrated, the driver of M1 and M2 interfaces with the local wordline or bitline. As illustrated, the driver of M3 and M4 interfaces with the global wordline or bitline.

In one example of a negative bias scenario, the mux is selected to provide VNN. In one example of the negative bias scenario for a selected decoder, LWLDESEL/LBLDESEL and GWLDESEL/GBLDESEL are driven to VNN. LWLSEL/LBLSEL and GWLSEL/GBLSEL are driven to VSS. VNN on M3 and VSS on M4 causes the global selector to drive VNN from the mux to GWL/GBL. VNN on M1 and VSS on M2 causes the circuit to drive LWL/LBL to GWL/GBL.

In one example of the negative bias scenario fora deselected decoder, LWLDESEL/LBLDESEL and GWLDESEL/GBLDESEL are driven to VCC, which represents a voltage level above VSS but lower than VPP. LWLSEL/LBLSEL and GWLSEL/GBLSEL are driven to VNN. VCC on M3 and VNN on M4 causes the global selector to drive VSS to GWL/GBL. VCC on M1 and VNN on M2 causes the circuit to drive LWL/LBL to VSS.

In one example of a positive bias scenario, the mux is selected to provide VPP. In one example of the positive bias scenario for a selected decoder, LWLDESEL/LBLDESEL and GWLDESEL/GBLDESEL are driven to VSS. LWLSEL/LBLSEL and GWLSEL/GBLSEL are driven to VPP. VSS on M3 and VPP on M4 causes the global selector to drive VPP from the mux to GWL/GBL. VSS on M1 and VPP on M2 causes the circuit to drive LWL/LBL to GWL/GBL.

In one example of the positive bias scenario for a deselected decoder, LWLDESEL/LBLDESEL and GWLDESEL/GBLDESEL are driven to VCC. LWLSEL/LBLSEL is driven to VNN and GWLSEL/GBLSEL is driven to VSS. VCC on M3 and VSS on M4 causes the global selector to drive VSS to GWL/GBL. VCC on M1 and VNN on M2 causes the circuit to drive LWL/LBL to VSS.

For decoder 510, there is no need for a high voltage transistor because the highest gate differentials are only VNN to VSS, except the VPP to VNN on the positive bias selected decoder. The polarity toggle sequence for decoder 510 can be as follows for negative to positive polarity: 1) the mux output is set to VSS; 2) switching VNN on M4 of the deselected decoder to VSS—the VCC on M3 does not change; 3) switching VNN on M1 of the selected decoder to VSS on M1 and VSS on M2 to VPP; 4) switching VNN on M3 of the selected decoder to VSS and VSS on M2 to VPP; and, 5) the mux output is set to VPP. The polarity toggle sequence for decoder 510 can be as follows for positive to negative polarity: 1) the mux output is set to VSS; 2) switching VSS on M4 of the deselected decoder to VNN—the VCC on M3 does not change; 3) switching VSS on M1 of the selected decoder to VNN on M1 and VPP on M2 to VSS; 4) switching VSS on M3 of the selected decoder to VNN and VPP on M2 to VSS; and, 5) the mux output is set to VNN. It will be observed that rather than switching the gate voltages directly from positive to negative or negative to positive, the toggle sequence first transitions to an intermediate voltage.

Figure 6:
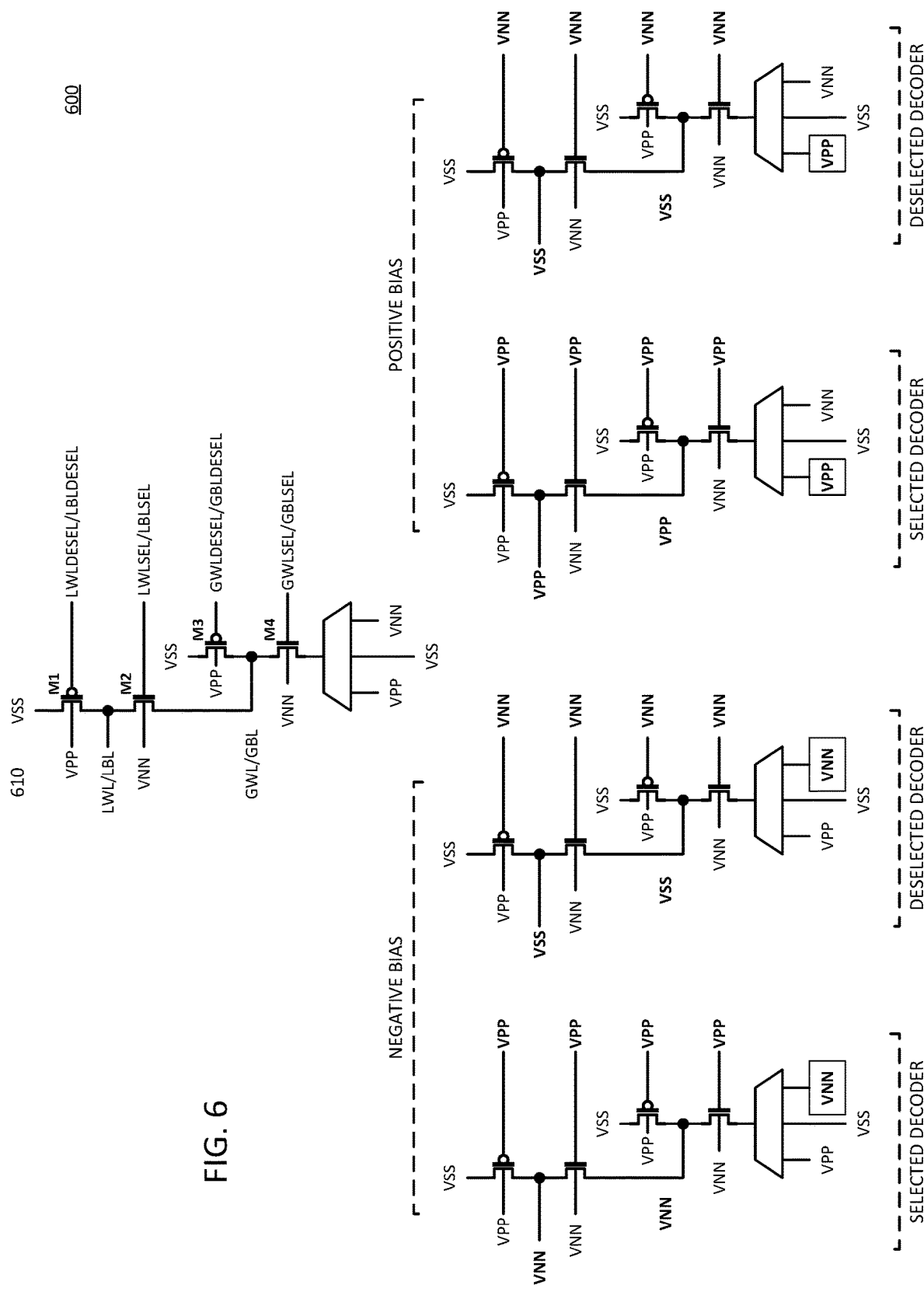
FIG. 6 is a diagram of an example of a bipolar complementary decoder with a high voltage select device to provide either high voltage bias or low voltage bias and a high voltage deselect device.

FIG. 6 is a diagram of an example of a bipolar complementary decoder with a high voltage select device to provide either high voltage bias or low voltage bias and a high voltage deselect device. Decoder 610 provides an example of a decoder in accordance with any decoder of system 100 or system 200. Diagram 600 illustrates a representation of the decoder design itself (decoder 610), as well as a representation of a negative bias condition and a representation of a positive bias condition for the decoder. Decoder 610 is specifically labeled with transistor numbers, which are to be understood as applying to the various additional diagrams for negative and positive bias, with selected and deselected decoders for each.

M1 represents a P-type transistor and M2 represents an N-type transistor. Together M1 and M2 provide a driver or selector for an LWL or LBL. The local wordline or bitline forms part of a crosspoint array of conductors. The conductor is labeled as LWL or LBL to represent the fact that the same decoder can be used for column decode operation or for row decode operation, or for both row decode and column decode. It will be understood that separate decoder devices will be used for row and column decoders, but the same decoder design can apply to either column or row decoders. M1 and M2 represent selectors for the local line.

In one example, M1 is driven by the local deselect signal (LWLDESEL or LBLDESEL). In one example, M2 is driven by the local select signal (LWLSEL or LBLSEL). Deselection will drive the LWL/LBL to VSS through M1. Selection will drive the LWL/LBL to the bias of the GWL/GBL through M2.

Decoder 610 includes transistors M3 and M4 for global selection, and can be referred to as global selectors or global select devices. M3 represents a P-type transistor and M4 represents an N-type transistor. In one example, M3 is driven by the global deselect signal (GWLDESEL/GBLDESEL). Deselection will drive GWL/GBL to VSS. M4 is driven by the global select signal (GWLSEL/GBLSEL). Selection will drive GWL/GBL to the output of the multi-plexer (mux). The multiplexer can provide VPP, VSS, or VNN. The mux selection can be controlled in combination with selection/deselection signals to drive the appropriate voltage level to the global line.

The circuit of M1 and M2 can apply a bias voltage to the local line. The circuit of M3 and M4 can provide a select device to selectively provide both high voltage bias and low voltage bias to the circuit of M1 and M2. From one perspective, the mux can be part of the select device. In one example of decoder 610, both the circuit to apply the bias to the local conductor line and the selector circuit are implemented as complementary metal oxide semiconductor (CMOS) drivers, with both P-type and N-type transistors. As illustrated, the driver of M1 and M2 interfaces with the local wordline or bitline. As illustrated, the driver of M3 and M4 interfaces with the global wordline or bitline.

In one example of a negative bias scenario, the mux is selected to provide VNN. In one example of the negative bias scenario for a selected decoder, LWLDESEL/LBLDESEL and GWLDESEL/GBLDESEL are driven to VPP. LWLSEL/LBLSEL and GWLSEL/GBLSEL are driven to VPP. VPP on M3 and M4 causes the global selector to drive VNN from the mux to GWL/GBL. VPP on M1 and M2 causes the circuit to drive LWL/LBL to GWL/GBL.

In one example of the negative bias scenario for a deselected decoder, LWLDESEL/LBLDESEL and GWLDESEL/GBLDESEL are driven to VNN. LWLSEL/LBLSEL and GWLSEL/GBLSEL are driven to VNN. VNN on M3 and M4 causes the global selector to drive VSS to GWL/GBL. VNN on M1 and M2 causes the circuit to drive LWL/LBL to VSS.

In one example of a positive bias scenario, the mux is selected to provide VPP. In one example of the positive bias scenario for a selected decoder, LWLDESEL/LBLDESEL and GWLDESEL/GBLDESEL are driven to VPP. LWLSEL/LBLSEL and GWLSEL/GBLSEL are driven to VPP. VPP on M3 and M4 causes the global selector to drive VPP from the mux to GWL/GBL. VPP on M1 and M2 causes the circuit to drive LWL/LBL to GWL/GBL.

In one example of the positive bias scenario for a deselected decoder, LWLDESEL/LBLDESEL and GWLDESEL/GBLDESEL are driven to VNN. LWLSEL/LBLSEL and GWLSEL/GBLSEL are driven to VNN. VNN on M3 and M4 causes the global selector to drive VSS to GWL/GBL. VNN on M1 and M2 causes the circuit to drive LWL/LBL to VSS.

For decoder 610, the bolded transistors are high voltage devices. Thus, M1, M2, M3, and M4 are all high voltage devices (HV). A high voltage device has a thick gate that can withstand the stress of a full voltage potential (e.g., rail to rail). Since the gate can withstand the stress of the voltage differential from rail to rail, the controller (not specifically shown) that sets the values for the decoder does not have to change the bias on the gates when switching polarity. With a high voltage device, the gate does not need to be toggled when polarity is switched.

For decoder 610 there is no polarity toggle sequence. When the decoder is set to positive bias, in one example the polarity can be changed to negative bias by simply setting the mux output to VNN. When the decoder is set to negative bias, in one example the polarity can be changed to positive bias by simply setting the mux output to VPP.

Figure 7:
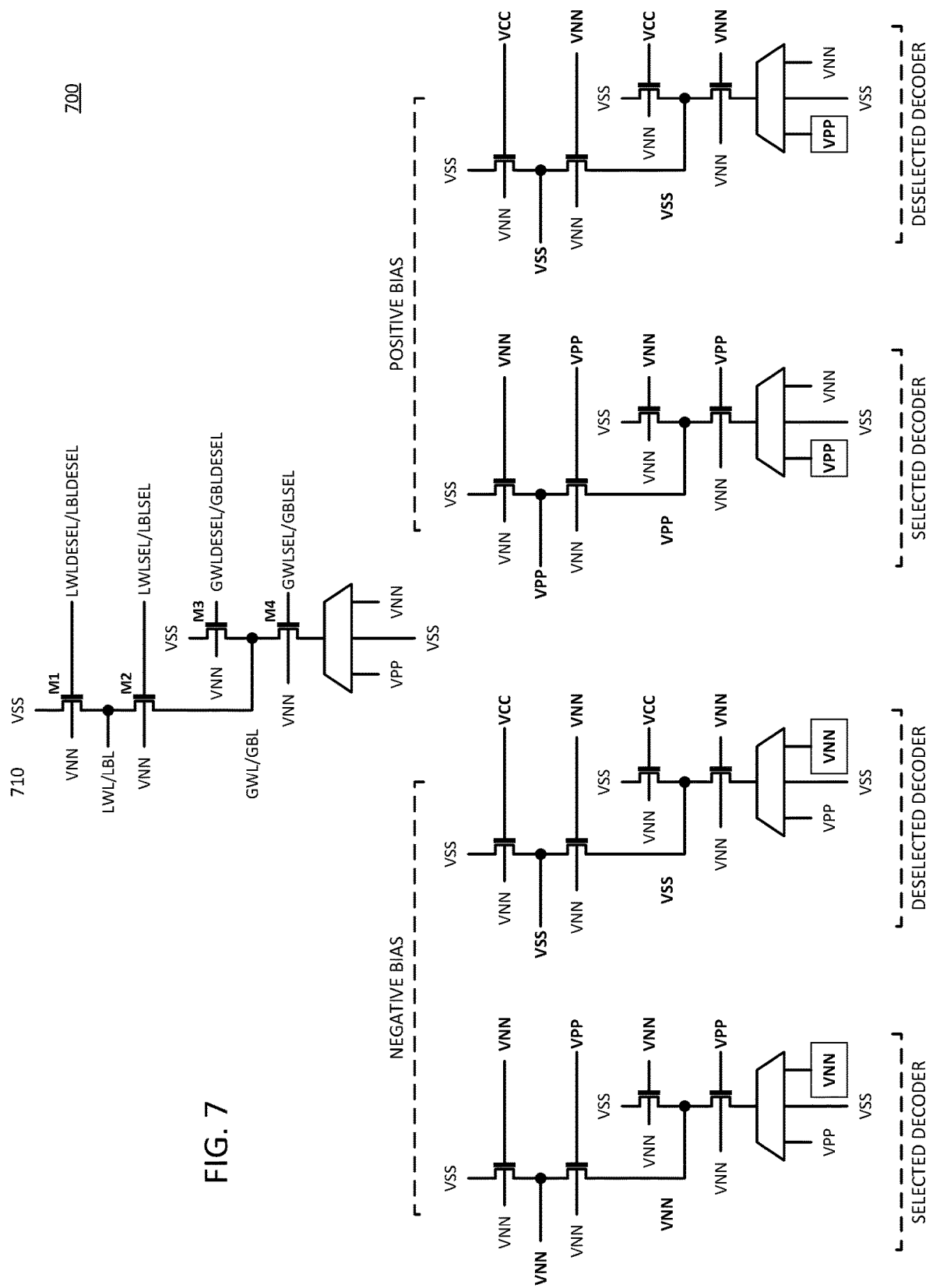
FIG. 7 is a diagram of an example of a bipolar decoder with a high voltage select device to provide either high voltage bias or low voltage bias and a high voltage deselect device.

FIG. 7 is a diagram of an example of a bipolar decoder with a high voltage select device to provide either high voltage bias or low voltage bias and a high voltage deselect device. Decoder 710 provides an example of a decoder in accordance with any decoder of system 100 or system 200.

Diagram 700 illustrates a representation of the decoder design itself (decoder 710), as well as a representation of a negative bias condition and a representation of a positive bias condition for the decoder. Decoder 710 is specifically labeled with transistor numbers, which are to be understood as applying to the various additional diagrams for negative and positive bias, with selected and deselected decoders for each.

M1 and M2 both represent N-type transistors. Together M1 and M2 provide a driver or selector for an LWL or LBL. The local wordline or bitline forms part of a crosspoint array of conductors. The conductor is labeled as LWL or LBL to represent the fact that the same decoder can be used for column decode operation or for row decode operation, or for both row decode and column decode. It will be understood that separate decoder devices will be used for row and column decoders, but the same decoder design can apply to either column or row decoders. M1 and M2 represent selectors for the local line.

In one example, M1 is driven by the local deselect signal (LWLDESEL or LBLDESEL). In one example, M2 is driven by the local select signal (LWLSEL or LBLSEL). Deselection will drive the LWL/LBL to VSS through M1. Selection will drive the LWL/LBL to the bias of the GWL/GBL through M2.

Decoder 710 includes transistors M3 and M4 for global selection, and can be referred to as global selectors or global select devices. M3 and M4 represent N-type transistors. Thus, decoder 710 represents a decoder with only N-type metal oxide semiconductor (NMOS) devices. In one example, M3 is driven by the global deselect signal (GWLDESEL/GBLDESEL). Deselection will drive GWL/GBL to VSS. M4 is driven by the global select signal (GWLSEL/GBLSEL). Selection will drive GWL/GBL to the output of the mux, which can provide VPP, VSS, or VNN. The mux selection can be controlled in combination with selection/deselection signals to drive the appropriate voltage level to the global line.

The circuit of M1 and M2 can apply a bias voltage to the local line. The circuit of M3 and M4 can provide a select device to selectively provide both high voltage bias and low voltage bias to the circuit of M1 and M2. From one perspective, the mux can be part of the select device. As illustrated, the driver of M1 and M2 interfaces with the local wordline or bitline. As illustrated, the driver of M3 and M4 interfaces with the global wordline or bitline.

In one example of a negative bias scenario, the mux is selected to provide VNN. In one example of the negative bias scenario for a selected decoder, LWLDESEL/LBLDESEL and GWLDESEL/GBLDESEL are driven to VNN. LWLSEL/LBLSEL and GWLSEL/GBLSEL are driven to VPP. VNN on M3 and VPP on M4 causes the global selector to drive VNN from the mux to GWL/GBL. VNN on M1 and VPP on M2 causes the circuit to drive LWL/LBL to GWL/GBL.

In one example of the negative bias scenario fora deselected decoder, LWLDESEL/LBLDESEL and GWLDESEL/GBLDESEL are driven to VCC. LWLSEL/LBLSEL and GWLSEL/GBLSEL are driven to VNN. VCC on M3 and VNN on M4 causes the global selector to drive VSS to GWL/GBL. VCC on M1 and VNN on M2 causes the circuit to drive LWL/LBL to VSS.

In one example of a positive bias scenario, the mux is selected to provide VPP. In one example of the positive bias scenario for a selected decoder, LWLDESEL/LBLDESEL and GWLDESEL/GBLDESEL are driven to VNN. LWLSEL/LBLSEL and GWLSEL/GBLSEL are driven to VPP. VNN on M3 and VPP on M4 causes the global selector to drive VPP from the mux to GWL/GBL. VNN on M1 and VPP on M2 causes the circuit to drive LWL/LBL to GWL/GBL.

In one example of the positive bias scenario for a deselected decoder, LWLDESEL/LBLDESEL and GWLDESEL/GBLDESEL are driven to VCC. LWLSEL/LBLSEL and GWLSEL/GBLSEL are driven to VNN. VCC on M3 and VNN on M4 causes the global selector to drive VSS to GWL/GBL. VCC on M1 and VNN on M2 causes the circuit to drive LWL/LBL to VSS.

For decoder 710, the bolded transistors are high voltage devices. Thus, M1, M2, M3, and M4 are all high voltage devices (HV). A high voltage device has a thick gate that can withstand the stress of a full voltage potential (e.g., rail to rail). Since the gate can withstand the stress of the voltage differential from rail to rail, the controller (not specifically shown) that sets the values for the decoder does not have to change the bias on the gates when switching polarity. With a high voltage device, the gate does not need to be toggled when polarity is switched.

For decoder 710 there is no polarity toggle sequence. When the decoder is set to positive bias, in one example the polarity can be changed to negative bias by simply setting the mux output to VNN. When the decoder is set to negative bias, in one example the polarity can be changed to positive bias by simply setting the mux output to VPP.

Figure 8:
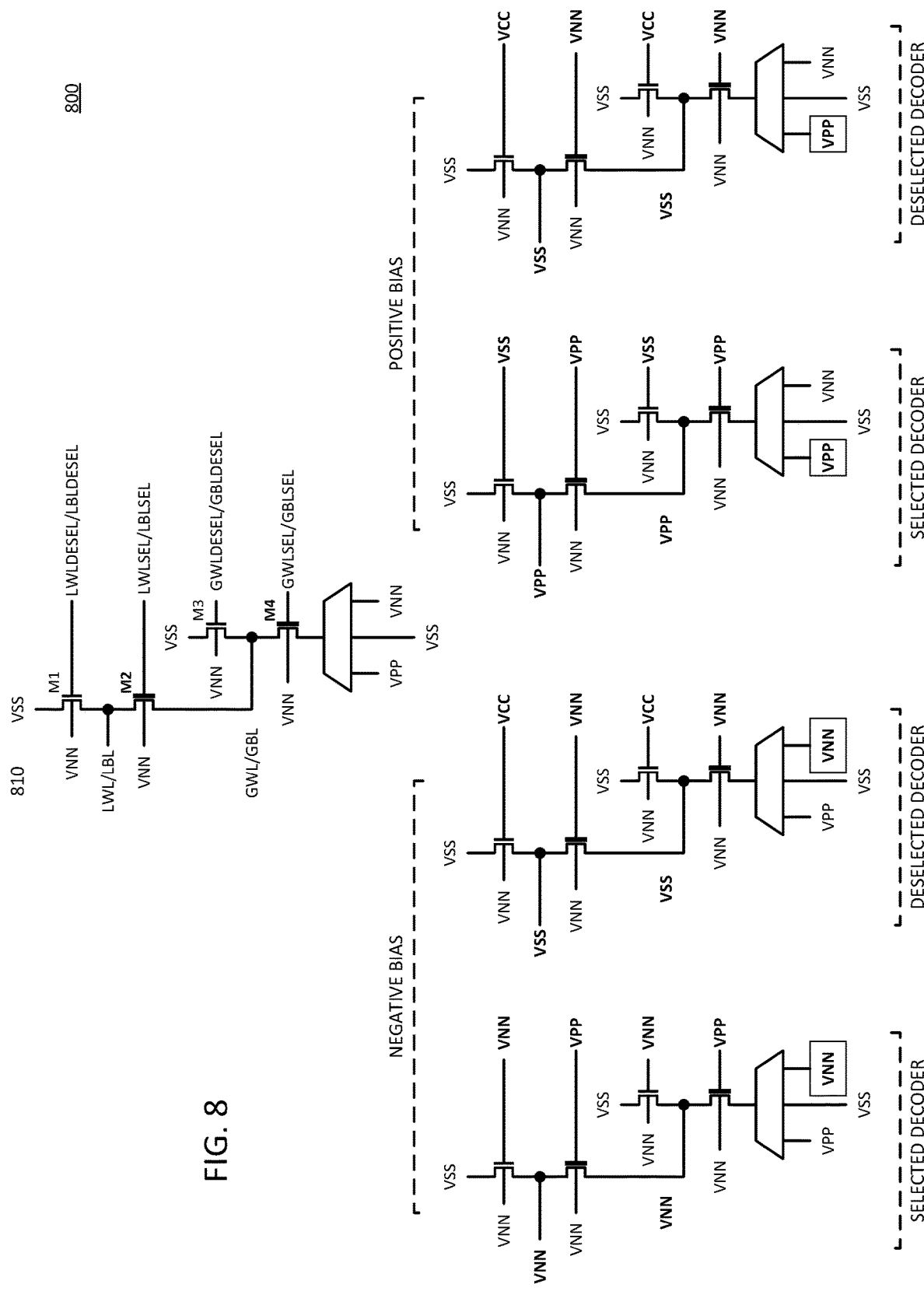
FIG. 8 is a diagram of an example of a bipolar complementary decoder with a high voltage select device to provide either high voltage bias or low voltage bias.

FIG. 8 is a diagram of an example of a bipolar complementary decoder with a high voltage select device to provide either high voltage bias or low voltage bias. Decoder 810 provides an example of a decoder in accordance with any decoder of system 100 or system 200. Diagram 800 illustrates a representation of the decoder design itself (decoder 810), as well as a representation of a negative bias condition and a representation of a positive bias condition for the decoder. Decoder 810 is specifically labeled with transistor numbers, which are to be understood as applying to the various additional diagrams for negative and positive bias, with selected and deselected decoders for each.

M1 and M2 both represent N-type transistors. Together M1 and M2 provide a driver or selector for an LWL or LBL. The local wordline or bitline forms part of a crosspoint array of conductors. The conductor is labeled as LWL or LBL to represent the fact that the same decoder can be used for column decode operation or for row decode operation, or for both row decode and column decode. It will be understood that separate decoder devices will be used for row and column decoders, but the same decoder design can apply to either column or row decoders. M1 and M2 represent selectors for the local line.

In one example, M1 is driven by the local deselect signal (LWLDESEL or LBLDESEL). In one example, M2 is driven by the local select signal (LWLSEL or LBLSEL). Deselection will drive the LWL/LBL to VSS through M1. Selection will drive the LWL/LBL to the bias of the GWL/GBL through M2.

Decoder 810 includes transistors M3 and M4 for global selection, and can be referred to as global selectors or global select devices. M3 and M4 represent N-type transistors. Thus, decoder 810 represents a decoder with only N-type metal oxide semiconductor (NMOS) devices. In one example, M3 is driven by the global deselect signal (GWLDESEL/GBLDESEL). Deselection will drive GWL/GBL to VSS. M4 is driven by the global select signal (GWLSEL/GBLSEL). Selection will drive GWL/GBL to the output of the mux, which can provide VPP, VSS, or VNN. The mux selection can be controlled in combination with selection/deselection signals to drive the appropriate voltage level to the global line.

The circuit of M1 and M2 can apply a bias voltage to the local line. The circuit of M3 and M4 can provide a select device to selectively provide both high voltage bias and low voltage bias to the circuit of M1 and M2. From one perspective, the mux can be part of the select device. As illustrated, the driver of M1 and M2 interfaces with the local wordline or bitline. As illustrated, the driver of M3 and M4 interfaces with the global wordline or bitline.

In one example of a negative bias scenario, the mux is selected to provide VNN. In one example of the negative bias scenario for a selected decoder, LWLDESEL/LBLDESEL and GWLDESEL/GBLDESEL are driven to VNN. LWLSEL/LBLSEL and GWLSEL/GBLSEL are driven to VPP. VNN on M3 and VPP on M4 causes the global selector to drive VNN from the mux to GWL/GBL. VNN on M1 and VPP on M2 causes the circuit to drive LWL/LBL to GWL/GBL.

In one example of the negative bias scenario fora deselected decoder, LWLDESEL/LBLDESEL and GWLDESEL/GBLDESEL are driven to VCC. LWLSEL/LBLSEL and GWLSEL/GBLSEL are driven to VNN. VCC on M3 and VNN on M4 causes the global selector to drive VSS to GWL/GBL. VCC on M1 and VNN on M2 causes the circuit to drive LWL/LBL to VSS.

In one example of a positive bias scenario, the mux is selected to provide VPP. In one example of the positive bias scenario for a selected decoder, LWLDESEL/LBLDESEL and GWLDESEL/GBLDESEL are driven to VSS. LWLSEL/LBLSEL and GWLSEL/GBLSEL are driven to VPP. VSS on M3 and VPP on M4 causes the global selector to drive VPP from the mux to GWL/GBL. VSS on M1 and VPP on M2 causes the circuit to drive LWL/LBL to GWL/GBL.

In one example of the positive bias scenario for a deselected decoder, LWLDESEL/LBLDESEL and GWLDESEL/GBLDESEL are driven to VCC. LWLSEL/LBLSEL and GWLSEL/GBLSEL are driven to VNN. VCC on M3 and VNN on M4 causes the global selector to drive VSS to GWL/GBL. VCC on M1 and VNN on M2 causes the circuit to drive LWL/LBL to VSS.

For decoder 810, the bolded transistors are high voltage devices. Thus, M2 and M4 are high voltage devices (HV). The high voltage transistors do not need to have the gate voltage switched to switch bias polarity. The non-high-voltage transistors still need to be transitioned to avoid stress.

The polarity toggle sequence for decoder 810 can be as follows for negative to positive polarity: 1) the mux output is set to VSS; 2) switching VNN on M3 of the deselected decoder to VSS—the VPP on M4 does not change; 3) switching VNN on M1 of the selected decoder to VSS on M1—the VPP on M2 does not change; and, 4) the mux output is set to VPP. The polarity toggle sequence for decoder 810 can be as follows for positive to negative polarity: 1) the mux output is set to VSS; 2) switching VSS on M3 of the deselected decoder to VNN—the VPP on M4 does not change; 3) switching VSS on M1 of the selected decoder to VNN on M1—the VPP on M2 does not change; and, 4) the mux output is set to VNN.

Figure 9:
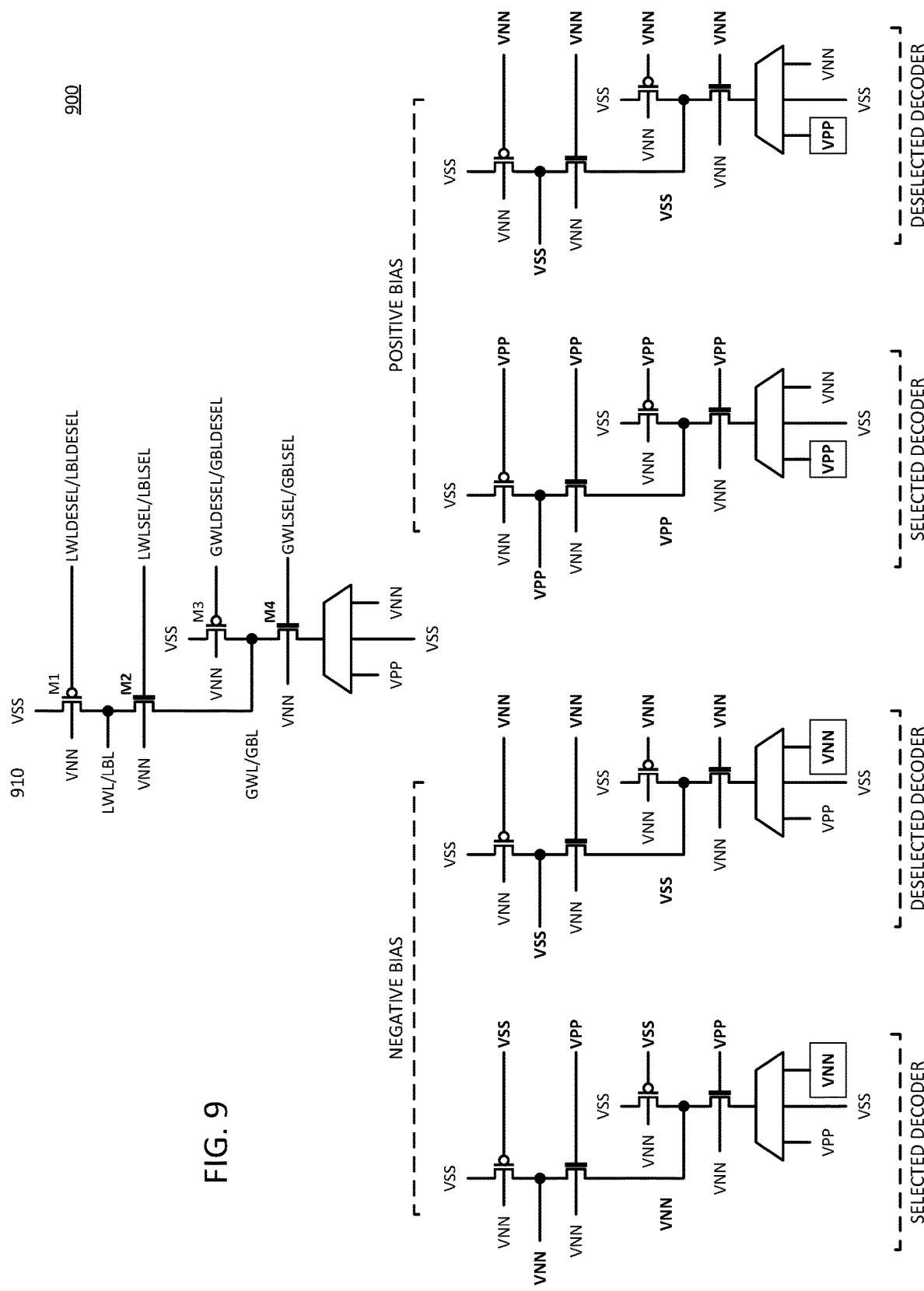
FIG. 9 is a diagram of an example of a bipolar decoder with a high voltage select device to provide either high voltage bias or low voltage bias.

FIG. 9 is a diagram of an example of a bipolar decoder with a high voltage select device to provide either high voltage bias or low voltage bias. Decoder 910 provides an example of a decoder in accordance with any decoder of system 100 or system 200. Diagram 900 illustrates a representation of the decoder design itself (decoder 810), as well as a representation of a negative bias condition and a representation of a positive bias condition for the decoder. Decoder 910 is specifically labeled with transistor numbers, which are to be understood as applying to the various additional diagrams for negative and positive bias, with selected and deselected decoders for each.

M1 represents a P-type transistor and M2 represents an N-type transistor. Together M1 and M2 provide a driver or selector for an LWL or LBL. The local wordline or bitline forms part of a crosspoint array of conductors. The conductor is labeled as LWL or LBL to represent the fact that the same decoder can be used for column decode operation or for row decode operation, or for both row decode and column decode. It will be understood that separate decoder devices will be used for row and column decoders, but the same decoder design can apply to either column or row decoders. M1 and M2 represent selectors for the local line.

In one example, M1 is driven by the local deselect signal (LWLDESEL or LBLDESEL). In one example, M2 is driven by the local select signal (LWLSEL or LBLSEL). Deselection will drive the LWL/LBL to VSS through M1. Selection will drive the LWL/LBL to the bias of the GWL/GBL through M2.

Decoder 910 includes transistors M3 and M4 for global selection, and can be referred to as global selectors or global select devices. M3 represents a P-type transistor and M4 represents an N-type transistor. In one example, M3 is driven by the global deselect signal (GWLDESEL/GBLDESEL). Deselection will drive GWL/GBL to VSS. M4 is driven by the global select signal (GWLSEL/GBLSEL). Selection will drive GWL/GBL to the output of the multiplexer (mux). The multiplexer can provide VPP, VSS, or VNN. The mux selection can be controlled in combination with selection/deselection signals to drive the appropriate voltage level to the global line.

The circuit of M1 and M2 can apply a bias voltage to the local line. The circuit of M3 and M4 can provide a select device to selectively provide both high voltage bias and low voltage bias to the circuit of M1 and M2. From one perspective, the mux can be part of the select device. In one example of decoder 910, both the circuit to apply the bias to the local conductor line and the selector circuit are implemented as complementary metal oxide semiconductor (CMOS) drivers, with both P-type and N-type transistors. As illustrated, the driver of M1 and M2 interfaces with the local wordline or bitline. As illustrated, the driver of M3 and M4 interfaces with the global wordline or bitline.

In one example of a negative bias scenario, the mux is selected to provide VNN. In one example of the negative bias scenario for a selected decoder, LWLDESEL/LBLDESEL and GWLDESEL/GBLDESEL are driven to VSS. LWLSEL/LBLSEL and GWLSEL/GBLSEL are driven to VPP. VSS on M3 and VPP on M4 causes the global selector to drive VNN from the mux to GWL/GBL. VSS on M1 and VPP on M2 causes the circuit to drive LWL/LBL to GWL/GBL.

In one example of the negative bias scenario fora deselected decoder, LWLDESEL/LBLDESEL and GWLDESEL/GBLDESEL are driven to VNN. LWLSEL/LBLSEL and GWLSEL/GBLSEL are driven to VNN. VNN on M3 and VNN on M4 causes the global selector to drive VSS to GWL/GBL. VNN on M1 and VNN on M2 causes the circuit to drive LWL/LBL to VSS.

In one example of a positive bias scenario, the mux is selected to provide VPP. In one example of the positive bias scenario for a selected decoder, LWLDESEL/LBLDESEL and GWLDESEL/GBLDESEL are driven to VPP. LWL-SEL/LBLSEL and GWLSEL/GBLSEL are driven to VPP. VPP on M3 and VPP on M4 causes the global selector to drive VPP from the mux to GWL/GBL. VPP on M1 and VPP on M2 causes the circuit to drive LWL/LBL to GWL/GBL.

In one example of the positive bias scenario for a deselected decoder, LWLDESEL/LBLDESEL and GWLDESEL/GBLDESEL are driven to VNN. LWLSEL/LBLSEL and GWLSEL/GBLSEL are driven to VNN. VNN on M3 and VNN on M4 causes the global selector to drive VSS to GWL/GBL. VNN on M1 and VNN on M2 causes the circuit to drive LWL/LBL to VSS.

For decoder 810, the bolded transistors are high voltage devices. Thus, M2 and M4 are high voltage devices (HV). The high voltage transistors do not need to have the gate voltage switched to switch bias polarity. The non-high-voltage transistors still need to be transitioned to avoid stress.

The polarity toggle sequence for decoder 910 can be as follows for negative to positive polarity: 1) the mux output is set to VSS; 2) switching VSS on M3 of the deselected decoder to VPP—the VPP on M4 does not change; 3) switching VSS on M1 of the selected decoder to VPP—the VPP on M2 does not change; and, 4) the mux output is set to VPP. The polarity toggle sequence for decoder 810 can be as follows for positive to negative polarity: 1) the mux output is set to VSS; 2) switching VPP on M3 of the deselected decoder to VSS—the VPP on M4 does not change; 3) switching VPP on M1 of the selected decoder to VSS—the VPP on M2 does not change; and, 4) the mux output is set to VNN.

Figure 10:
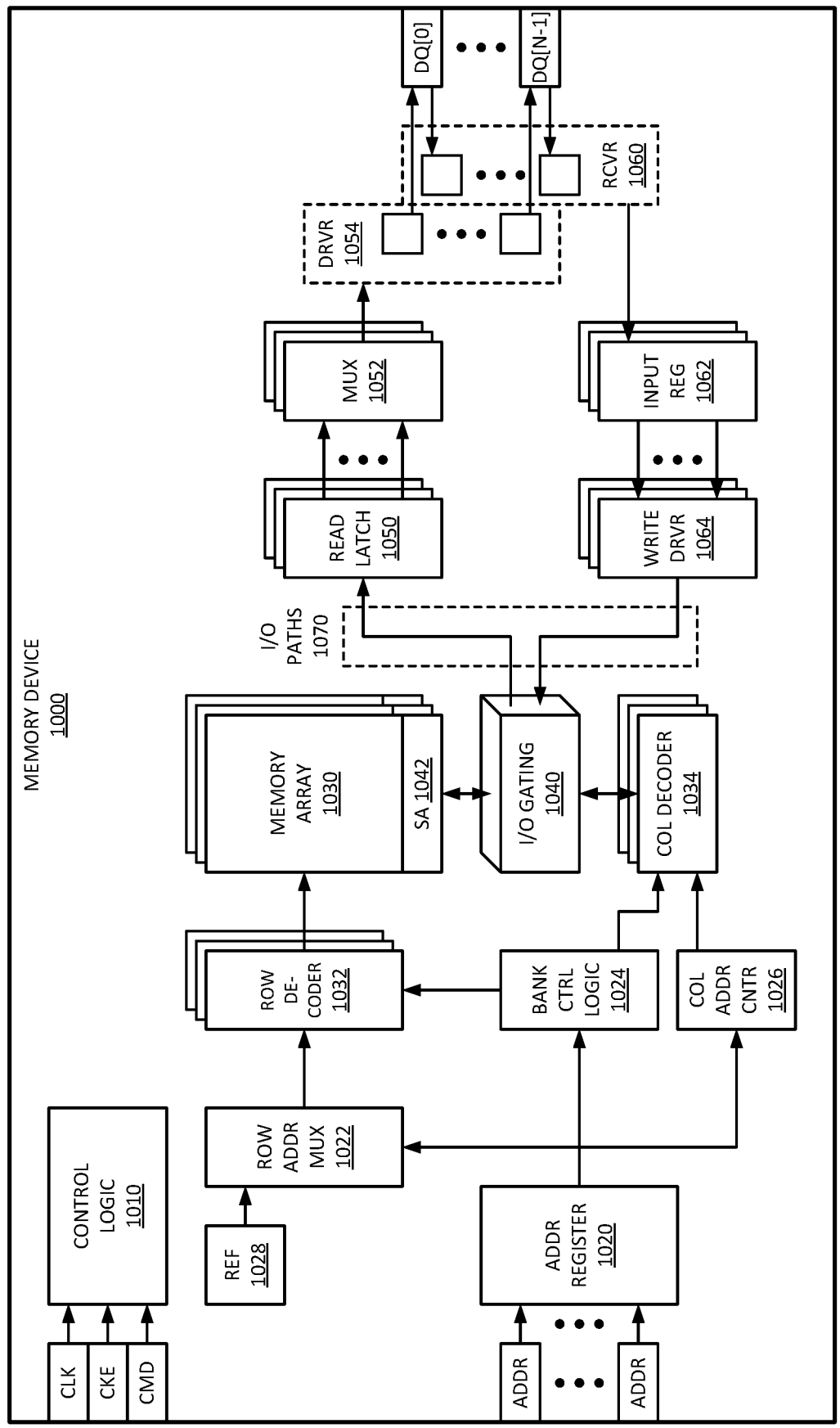
FIG. 10 is a block diagram of an example of a memory device with a decoder that has a device to provide both high voltage bias and low voltage bias.

FIG. 10 is a block diagram of an example of a memory device with a decoder that has a device to provide both high voltage bias and low voltage bias. Memory device 1000 represents one example of a memory device in accordance with any example herein. Row decoder 1032 and column decoder 1034 can be decoders in accordance with any decoder example provided herein.

Control logic 1010 receives clock (CLK), clock enable (CKE), and command signals (CMD), and controls the operation of memory device 1000 in relation to those signals. Address register 1020 receives row address and bank address signals to identify the portion of memory that is to be affected by a particular command. The address, clock, clock enable, and command signals represent I/O connectors for command and address for memory device 1000. In one example, address register 1020 distributes the address information to row address multiplexer 1022, bank control logic 1024, and column address counter 1026. Row address mux 1022 takes the row address information and a refresh counter (REF 1028) as input, and controls the row address latch (RAL) and decoder (row decoder 1032) for each bank of the memory device. Bank control logic 1024 selects which bank will be selected for the memory access operation (e.g., based on the command) received. Column address counter 1026 generates a signal to select the column for the operation.

Row decoder 1032 selects an address in a bank, which can include a row of memory array 1030. In one example, memory arrays 1030 can be or include subarrays. Signals from bank control logic 1024 and column address counter 1026 can trigger column decoder (col dec) 1034 to activate the appropriate sense amplifiers (SA) 1042 for the desired memory array 1030. Column decoder 1034 can trigger I/O gating 1040, which represent the hardware including signal lines or wires as well as logic to route data to and from memory arrays 1030. I/O gating 1040 can place data into sense amplifiers 1042 for a write operation, and can read the data out for a read operation. Column decoder 1034 makes a column selection for I/O gating 1040 based on bank control logic selection and the column address counter selection and.

In one example, read latch 1050 is coupled to receive data bits from I/O gating 1040 for a read operation. Read latch 1050 feeds the data into mux 1052, which can select the number of bits corresponding to the device data interface (the N DQ bits illustrated in memory device 1000. Mux 1052 can send the data to driver 1054, which will drive the data on I/O connectors DQ[0:(N−1)]. While not specifically illustrated, it will be understood that driver 1054 can drive on or more data strobe lines based on the timing. For a write operation, the controller will provide data on DQ[0:(N−1)]. In one example, receiver 1060 receives write data from the data bus, and inputs it into input register or input buffer 1062. In one example, receiver 1060 receives a data mask signal (DM) that can indicate when the memory device should perform a read operation. Input register 1062 samples the data in accordance with a data strobe line, and can latch the data to write driver 1064, which provides the data to I/O gating 1040.

In one example, memory device 1000 includes I/O paths 1070 to transfer data between I/O gating 1040 and the read and write paths. Thus, in one example a data path includes a read path and a write path. I/O paths 1070 can be specifically routed to map one or more memory arrays 1030 to specific I/O connectors, referring to DQ[0:(N−1)].

Figure 11:
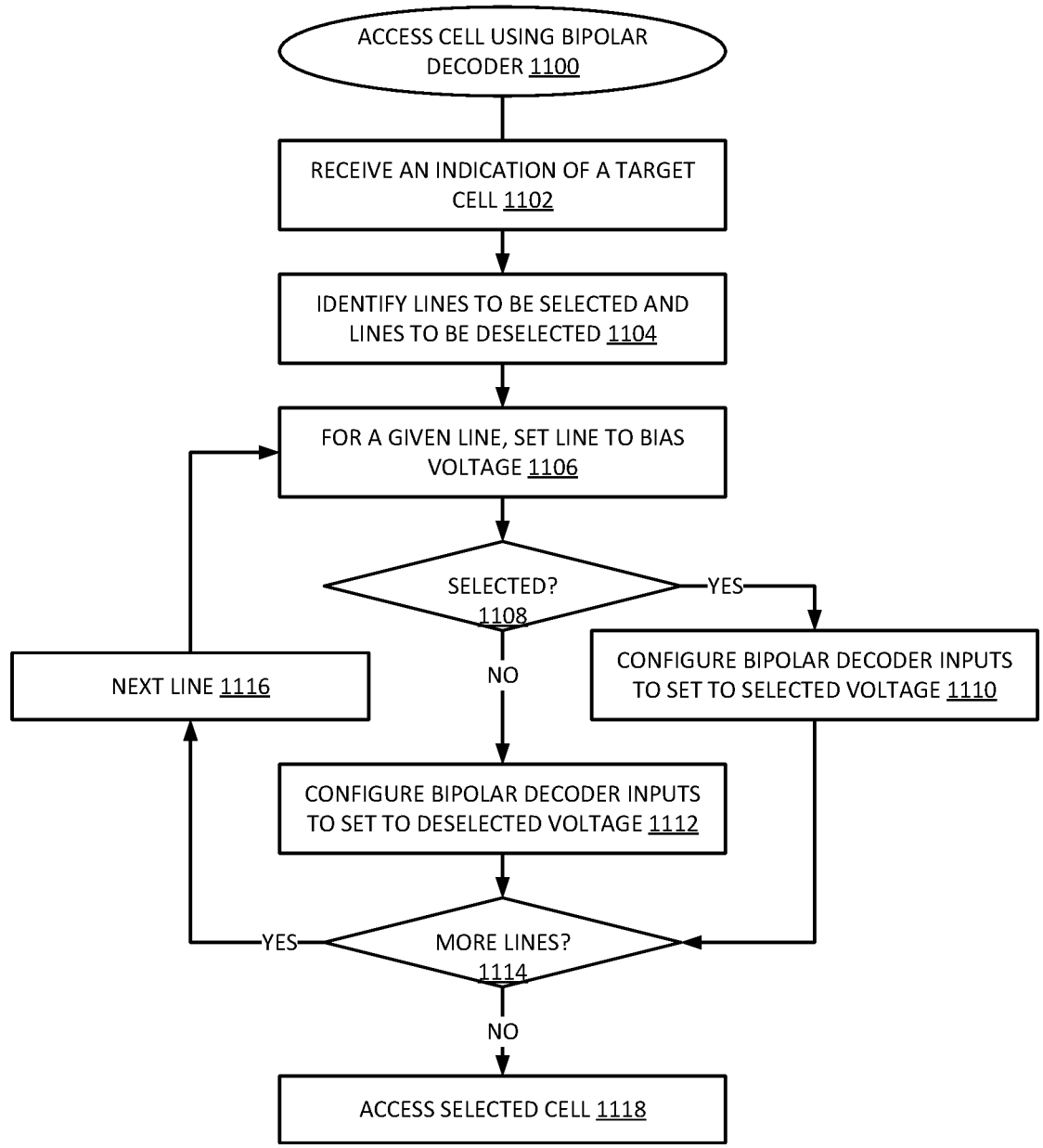
FIG. 11 is a flow diagram of an example of a process for providing bias voltage with a decoder that has a device to provide both high voltage bias and low voltage bias.

FIG. 11 is a flow diagram of an example of a process for providing bias voltage with a decoder that has a device to provide both high voltage bias and low voltage bias. Process 1100 provides an example of a process for accessing a cell using a bipolar decoder. More particularly, the process of access to a bitcell will involve the use of row decoders for a selected row and deselected rows, and column decoders for a selected column and deselected columns. The decoders can be any example of bipolar decoders described.

In one example, the access controller, such as control logic for a memory device, receives an indication of a target cell to be accessed, at 1102. The control logic can identify the row and column lines to be selected and which rows and columns should be deselected to access the target cell, at 1104.

For a given line (either row or column), the controller sets select and deselect signals to set the line voltage to the appropriate bias voltage, at 1106. If the line is to be selected, at 1108 YES branch, the controller is to configure the bipolar decoder inputs to set the selected bias voltage for the line to be driven by the decoder, at 1110. In one example, if the line is to be deselected, at 1108 NO branch, the controller is to configure the bipolar decoder inputs to set the deselected bias voltage for the line to be driven by the decoder, at 1112.

After setting the line to the selected or deselected bias voltage, the controller can determine if there are more lines to bias, at 1114. If there are no more lines to bias, at 1114 NO branch, the controller can access the selected cell, at 1118. If there are more lines to bias, at 1114 YES branch, the controller can change to controlling the next line for selection or deselection, at 1116. As a practical matter, the selected lines will typically be selected together or substantially simultaneously. For example, the control inputs for both the row and column decoders for the selected lines can be configured together. Also, at the same time or substantially at the simultaneously, the controller can configure the deselected lines for all deselected lines. As such, in effect there may not be loop for different lines, other than propagation of the voltages from one device to the next.

Figure 12:
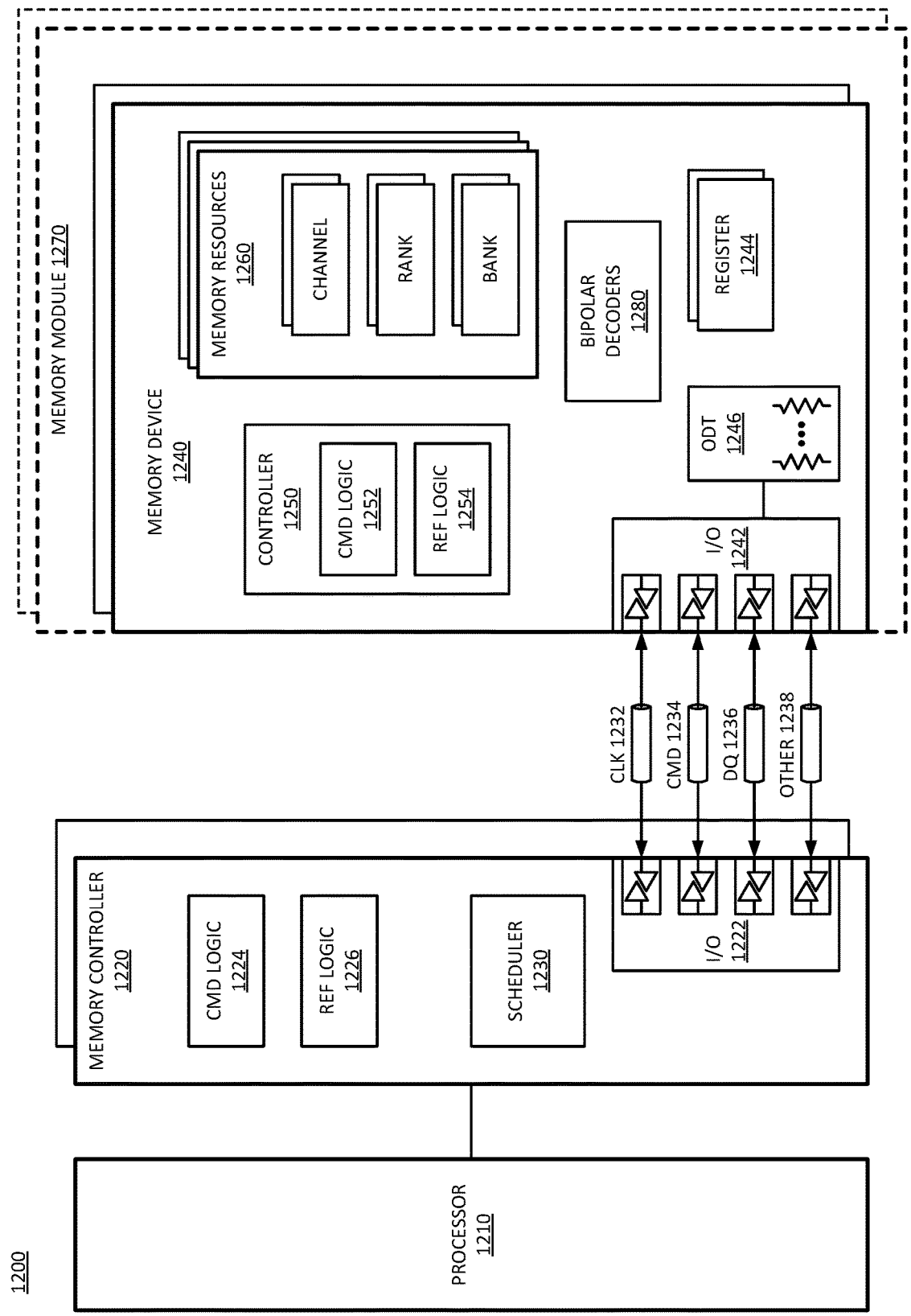
FIG. 12 is a block diagram of an example of a memory subsystem in which a decoder with a device to provide both high voltage bias and low voltage bias can be implemented.

FIG. 12 is a block diagram of an example of a memory subsystem in which a decoder with a device to provide both high voltage bias and low voltage bias can be implemented. System 1200 includes a processor and elements of a memory subsystem in a computing device. System 1200 includes a memory array with memory resources 1260, which can be a memory array in accordance with an example of system 100 of FIG. 1.

In one example, bipolar decoders 1280 represent bipolar decoders in accordance with any example provided herein. The bipolar decoders enable memory device 1240 to provide selection of a target cell within memory resources 1260. The use of the described bipolar decoders enables selection with lower energy usage as compared to traditional decoders.

In one example, memory module 1270 represents a DIMM, and includes a register (e.g., an RDIMM or registered DIMM). In one example, memory module 1270 includes multiple buffers that are separately addressable. In an RDIMM, the register buffers the C/A bus, but the data lines can be buffered. The command bus specific PDA operation as described herein can be utilized in system 1200 with or without a register or buffer or registered clock device.

Processor 1210 represents a processing unit of a computing platform that may execute an operating system (OS) and applications, which can collectively be referred to as the host or the user of the memory. The OS and applications execute operations that result in memory accesses. Processor 1210 can include one or more separate processors. Each separate processor can include a single processing unit, a multicore processing unit, or a combination. The processing unit can be a primary processor such as a CPU (central processing unit), a peripheral processor such as a GPU (graphics processing unit), or a combination. Memory accesses may also be initiated by devices such as a network controller or hard disk controller. Such devices can be integrated with the processor in some systems or attached to the processer via a bus (e.g., PCI express), or a combination. System 1200 can be implemented as an SOC (system on a chip), or be implemented with standalone components.

Reference to memory devices can apply to different memory types. Memory devices often refers to volatile memory technologies. Volatile memory is memory whose state (and therefore the data stored on it) is indeterminate if power is interrupted to the device. Nonvolatile memory refers to memory whose state is determinate even if power is interrupted to the device. Dynamic volatile memory requires refreshing the data stored in the device to maintain state. One example of dynamic volatile memory includes DRAM (dynamic random access memory), or some variant such as synchronous DRAM (SDRAM). A memory subsystem as described herein may be compatible with a number of memory technologies, such as DDR4 (DDR version 4, JESD79, initial specification published in September 2012 by JEDEC), LPDDR4 (low power DDR version 4, JESD209-4, originally published by JEDEC in August 2014), WIO2 (Wide I/O 2 (WideIO2), JESD229-2, originally published by JEDEC in August 2014), HBM (high bandwidth memory DRAM, JESD235A, originally published by JEDEC in November 2015), DDR5 (DDR version 5, currently in discussion by JEDEC), LPDDR5 (currently in discussion by JEDEC), HBM2 ((HBM version 2), currently in discussion by JEDEC), or others or combinations of memory technologies, and technologies based on derivatives or extensions of such specifications.

In addition to, or alternatively to, volatile memory, in one example, reference to memory devices can refer to a nonvolatile memory device whose state is determinate even if power is interrupted to the device. In one example, the nonvolatile memory device is a block addressable memory device, such as NAND or NOR technologies. Thus, a memory device can also include a future generation nonvolatile devices, such as a three dimensional crosspoint memory device, other byte addressable nonvolatile memory devices, or memory devices that use chalcogenide phase change material (e.g., chalcogenide glass). In one example, the memory device can be or include multi-threshold level NAND flash memory, NOR flash memory, single or multi-level phase change memory (PCM) or phase change memory with a switch (PCMS), a resistive memory, nanowire memory, ferroelectric transistor random access memory (FeTRAM), magnetoresistive random access memory (MRAM) memory that incorporates memristor technology, or spin transfer torque (STT)-MRAM, or a combination of any of the above, or other memory.

Descriptions herein referring to a "RAM" or "RAM device" can apply to any memory device that allows random access, whether volatile or nonvolatile. Descriptions referring to a "DRAM" or a "DRAM device" can refer to a volatile random access memory device. The memory device or DRAM can refer to the die itself, to a packaged memory product that includes one or more dies, or both. In one example, a system with volatile memory that needs to be refreshed can also include nonvolatile memory.

Memory controller 1220 represents one or more memory controller circuits or devices for system 1200. Memory controller 1220 represents control logic that generates memory access commands in response to the execution of operations by processor 1210. Memory controller 1220 accesses one or more memory devices 1240. Memory devices 1240 can be DRAM devices in accordance with any referred to above. In one example, memory devices 1240 are organized and managed as different channels, where each channel couples to buses and signal lines that couple to multiple memory devices in parallel. Each channel is independently operable. Thus, each channel is independently accessed and controlled, and the timing, data transfer, command and address exchanges, and other operations are separate for each channel. Coupling can refer to an electrical coupling, communicative coupling, physical coupling, or a combination of these. Physical coupling can include direct contact. Electrical coupling includes an interface or interconnection that allows electrical flow between components, or allows signaling between components, or both. Communicative coupling includes connections, including wired or wireless, that enable components to exchange data.

In one example, settings for each channel are controlled by separate mode registers or other register settings. In one example, each memory controller 1220 manages a separate memory channel, although system 1200 can be configured to have multiple channels managed by a single controller, or to have multiple controllers on a single channel. In one example, memory controller 1220 is part of host processor 1210, such as logic implemented on the same die or implemented in the same package space as the processor.

Memory controller 1220 includes I/O interface logic 1222 to couple to a memory bus, such as a memory channel as referred to above. I/O interface logic 1222 (as well as I/O interface logic 1242 of memory device 1240) can include pins, pads, connectors, signal lines, traces, or wires, or other hardware to connect the devices, or a combination of these. I/O interface logic 1222 can include a hardware interface. As illustrated, I/O interface logic 1222 includes at least drivers/ transceivers for signal lines. Commonly, wires within an integrated circuit interface couple with a pad, pin, or connector to interface signal lines or traces or other wires between devices. I/O interface logic 1222 can include drivers, receivers, transceivers, or termination, or other circuitry or combinations of circuitry to exchange signals on the signal lines between the devices. The exchange of signals includes at least one of transmit or receive. While shown as coupling I/O 1222 from memory controller 1220 to I/O 1242 of memory device 1240, it will be understood that in an implementation of system 1200 where groups of memory devices 1240 are accessed in parallel, multiple memory devices can include I/O interfaces to the same interface of memory controller 1220. In an implementation of system 1200 including one or more memory modules 1270, I/O 1242 can include interface hardware of the memory module in addition to interface hardware on the memory device itself. Other memory controllers 1220 will include separate interfaces to other memory devices 1240.

The bus between memory controller 1220 and memory devices 1240 can be implemented as multiple signal lines coupling memory controller 1220 to memory devices 1240. The bus may typically include at least clock (CLK) 1232, command/address (CMD) 1234, and write data (DQ) and read data (DQ) 1236, and zero or more other signal lines 1238. In one example, a bus or connection between memory controller 1220 and memory can be referred to as a memory bus. The signal lines for CMD can be referred to as a "C/A bus" (or ADD/CMD bus, or some other designation indicating the transfer of commands (C or CMD) and address (A or ADD) information) and the signal lines for write and read DQ can be referred to as a "data bus." In one example, independent channels have different clock signals, C/A buses, data buses, and other signal lines. Thus, system 1200 can be considered to have multiple "buses," in the sense that an independent interface path can be considered a separate bus. It will be understood that in addition to the lines explicitly shown, a bus can include at least one of strobe signaling lines, alert lines, auxiliary lines, or other signal lines, or a combination. It will also be understood that serial bus technologies can be used for the connection between memory controller 1220 and memory devices 1240. An example of a serial bus technology is 8B10B encoding and transmission of high-speed data with embedded clock over a single differential pair of signals in each direction. In one example, CMD 1234 represents signal lines shared in parallel with multiple memory devices. In one example, multiple memory devices share encoding command signal lines of CMD 1234, and each has a separate chip select (CS_n) signal line to select individual memory devices.

It will be understood that in the example of system 1200, the bus between memory controller 1220 and memory devices 1240 includes a subsidiary command bus CMD 1234 and a subsidiary bus to carry the write and read data, DQ 1236. In one example, the data bus can include bidirectional lines for read data and for write/command data. In another example, the subsidiary bus DQ 1236 can include unidirectional write signal lines for write and data from the host to memory, and can include unidirectional lines for read data from the memory to the host. In accordance with the chosen memory technology and system design, other signals 1238 may accompany a bus or sub bus, such as strobe lines DQS. Based on design of system 1200, or implementation if a design supports multiple implementations, the data bus can have more or less bandwidth per memory device 1240. For example, the data bus can support memory devices that have either a x32 interface, a x16 interface, a x8 interface, or other interface. The convention "xW," where W is an integer that refers to an interface size or width of the interface of memory device 1240, which represents a number of signal lines to exchange data with memory controller 1220. The interface size of the memory devices is a controlling factor on how many memory devices can be used concurrently per channel in system 1200 or coupled in parallel to the same signal lines. In one example, high bandwidth memory devices, wide interface devices, or stacked memory configurations, or combinations, can enable wider interfaces, such as a x128 interface, a x256 interface, a x512 interface, a x1024 interface, or other data bus interface width.

In one example, memory devices 1240 and memory controller 1220 exchange data over the data bus in a burst, or a sequence of consecutive data transfers. The burst corresponds to a number of transfer cycles, which is related to a bus frequency. In one example, the transfer cycle can be a whole clock cycle for transfers occurring on a same clock or strobe signal edge (e.g., on the rising edge). In one example, every clock cycle, referring to a cycle of the system clock, is separated into multiple unit intervals (UIs), where each UI is a transfer cycle. For example, double data rate transfers trigger on both edges of the clock signal (e.g., rising and falling). A burst can last for a configured number of UIs, which can be a configuration stored in a register, or triggered on the fly. For example, a sequence of eight consecutive transfer periods can be considered a burst length 8 (BL8), and each memory device 1240 can transfer data on each UI. Thus, a x8 memory device operating on BL8 can transfer 64 bits of data (8 data signal lines times 8 data bits transferred per line over the burst). It will be understood that this simple example is merely an illustration and is not limiting.

Memory devices 1240 represent memory resources for system 1200. In one example, each memory device 1240 is a separate memory die. In one example, each memory device 1240 can interface with multiple (e.g., 2) channels per device or die. Each memory device 1240 includes I/O interface logic 1242, which has a bandwidth determined by the implementation of the device (e.g., x16 or x8 or some other interface bandwidth). I/O interface logic 1242 enables the memory devices to interface with memory controller 1220. I/O interface logic 1242 can include a hardware interface, and can be in accordance with I/O 1222 of memory controller, but at the memory device end. In one example, multiple memory devices 1240 are connected in parallel to the same command and data buses. In another example, multiple memory devices 1240 are connected in parallel to the same command bus, and are connected to different data buses. For example, system 1200 can be configured with multiple memory devices 1240 coupled in parallel, with each memory device responding to a command, and accessing memory resources 1260 internal to each. For a Write operation, an individual memory device 1240 can write a portion of the overall data word, and for a Read operation, an individual memory device 1240 can fetch a portion of the overall data word. As non-limiting examples, a specific memory device can provide or receive, respectively, 8 bits of a 128-bit data word for a Read or Write transaction, or 8 bits or 16 bits (depending for a x8 or a x16 device) of a 256-bit data word. The remaining bits of the word will be provided or received by other memory devices in parallel.

In one example, memory devices 1240 are disposed directly on a motherboard or host system platform (e.g., a PCB (printed circuit board) on which processor 1210 is disposed) of a computing device. In one example, memory devices 1240 can be organized into memory modules 1270. In one example, memory modules 1270 represent dual inline memory modules (DIMMs). In one example, memory modules 1270 represent other organization of multiple memory devices to share at least a portion of access or control circuitry, which can be a separate circuit, a separate device, or a separate board from the host system platform. Memory modules 1270 can include multiple memory devices 1240, and the memory modules can include support for multiple separate channels to the included memory devices disposed on them. In another example, memory devices 1240 may be incorporated into the same package as memory controller 1220, such as by techniques such as multi-chip-module (MCM), package-on-package, through-silicon via (TSV), or other techniques or combinations. Similarly, in one example, multiple memory devices 1240 may be incorporated into memory modules 1270, which themselves may be incorporated into the same package as memory controller 1220. It will be appreciated that for these and other implementations, memory controller 1220 may be part of host processor 1210.

Memory devices 1240 each include memory resources 1260. Memory resources 1260 represent individual arrays of memory locations or storage locations for data. Typically memory resources 1260 are managed as rows of data, accessed via wordline (rows) and bitline (individual bits within a row) control. Memory resources 1260 can be organized as separate channels, ranks, and banks of memory. Channels may refer to independent control paths to storage locations within memory devices 1240. Ranks may refer to common locations across multiple memory devices (e.g., same row addresses within different devices). Banks may refer to arrays of memory locations within a memory device 1240. In one example, banks of memory are divided into sub-banks with at least a portion of shared circuitry (e.g., drivers, signal lines, control logic) for the sub-banks, allowing separate addressing and access. It will be understood that channels, ranks, banks, sub-banks, bank groups, or other organizations of the memory locations, and combinations of the organizations, can overlap in their application to physical resources. For example, the same physical memory locations can be accessed over a specific channel as a specific bank, which can also belong to a rank. Thus, the organization of memory resources will be understood in an inclusive, rather than exclusive, manner.

In one example, memory devices 1240 include one or more registers 1244. Register 1244 represents one or more storage devices or storage locations that provide configuration or settings for the operation of the memory device. In one example, register 1244 can provide a storage location for memory device 1240 to store data for access by memory controller 1220 as part of a control or management operation. In one example, register 1244 includes one or more Mode Registers. In one example, register 1244 includes one or more multipurpose registers. The configuration of locations within register 1244 can configure memory device 1240 to operate in different "modes," where command information can trigger different operations within memory device 1240 based on the mode. Additionally or in the alternative, different modes can also trigger different operation from address information or other signal lines depending on the mode. Settings of register 1244 can indicate configuration for I/O settings (e.g., timing, termination or ODT (on-die termination) 1246, driver configuration, or other I/O settings).

In one example, memory device 1240 includes ODT 1246 as part of the interface hardware associated with I/O 1242. ODT 1246 can be configured as mentioned above, and provide settings for impedance to be applied to the interface to specified signal lines. In one example, ODT 1246 is applied to DQ signal lines. In one example, ODT 1246 is applied to command signal lines. In one example, ODT 1246 is applied to address signal lines. In one example, ODT 1246 can be applied to any combination of the preceding. The ODT settings can be changed based on whether a memory device is a selected target of an access operation or a non-target device. ODT 1246 settings can affect the timing and reflections of signaling on the terminated lines. Careful control over ODT 1246 can enable higher-speed operation with improved matching of applied impedance and loading. ODT 1246 can be applied to specific signal lines of I/O interface 1242, 1222, and is not necessarily applied to all signal lines.

Memory device 1240 includes controller 1250, which represents control logic within the memory device to control internal operations within the memory device. For example, controller 1250 decodes commands sent by memory controller 1220 and generates internal operations to execute or satisfy the commands. Controller 1250 can be referred to as an internal controller, and is separate from memory controller 1220 of the host. Controller 1250 can determine what mode is selected based on register 1244, and configure the internal execution of operations for access to memory resources 1260 or other operations based on the selected mode. Controller 1250 generates control signals to control the routing of bits within memory device 1240 to provide a proper interface for the selected mode and direct a command to the proper memory locations or addresses. Controller 1250 includes command logic 1252, which can decode command encoding received on command and address signal lines. Thus, command logic 1252 can be or include a command decoder. With command logic 1252, memory device can identify commands and generate internal operations to execute requested commands.

Referring again to memory controller 1220, memory controller 1220 includes command (CMD) logic 1224, which represents logic or circuitry to generate commands to send to memory devices 1240. The generation of the commands can refer to the command prior to scheduling, or the preparation of queued commands ready to be sent. Generally, the signaling in memory subsystems includes address information within or accompanying the command to indicate or select one or more memory locations where the memory devices should execute the command. In response to scheduling of transactions for memory device 1240, memory controller 1220 can issue commands via I/O 1222 to cause memory device 1240 to execute the commands. In one example, controller 1250 of memory device 1240 receives and decodes command and address information received via I/O 1242 from memory controller 1220. Based on the received command and address information, controller 1250 can control the timing of operations of the logic and circuitry within memory device 1240 to execute the commands. Controller 1250 is responsible for compliance with standards or specifications within memory device 1240, such as timing and signaling requirements. Memory controller 1220 can implement compliance with standards or specifications by access scheduling and control.

Memory controller 1220 includes scheduler 1230, which represents logic or circuitry to generate and order transactions to send to memory device 1240. From one perspective, the primary function of memory controller 1220 could be said to schedule memory access and other transactions to memory device 1240. Such scheduling can include generating the transactions themselves to implement the requests for data by processor 1210 and to maintain integrity of the data (e.g., such as with commands related to refresh). Transactions can include one or more commands, and result in the transfer of commands or data or both over one or multiple timing cycles such as clock cycles or unit intervals. Transactions can be for access such as read or write or related commands or a combination, and other transactions can include memory management commands for configuration, settings, data integrity, or other commands or a combination.

Memory controller 1220 typically includes logic such as scheduler 1230 to allow selection and ordering of transactions to improve performance of system 1200. Thus, memory controller 1220 can select which of the outstanding transactions should be sent to memory device 1240 in which order, which is typically achieved with logic much more complex that a simple first-in first-out algorithm. Memory controller 1220 manages the transmission of the transactions to memory device 1240, and manages the timing associated with the transaction. In one example, transactions have deterministic timing, which can be managed by memory controller 1220 and used in determining how to schedule the transactions with scheduler 1230.

In one example, memory controller 1220 includes refresh (REF) logic 1226. Refresh logic 1226 can be used for memory resources that are volatile and need to be refreshed to retain a deterministic state. In one example, refresh logic 1226 indicates a location for refresh, and a type of refresh to perform. Refresh logic 1226 can trigger self-refresh within memory device 1240, or execute external refreshes which can be referred to as auto refresh commands) by sending refresh commands, or a combination. In one example, system 1200 supports all bank refreshes as well as per bank refreshes. All bank refreshes cause the refreshing of banks within all memory devices 1240 coupled in parallel. Per bank refreshes cause the refreshing of a specified bank within a specified memory device 1240. In one example, controller 1250 within memory device 1240 includes refresh logic 1254 to apply refresh within memory device 1240. In one example, refresh logic 1254 generates internal operations to perform refresh in accordance with an external refresh received from memory controller 1220. Refresh logic 1254 can determine if a refresh is directed to memory device 1240, and what memory resources 1260 to refresh in response to the command.

Figure 13:
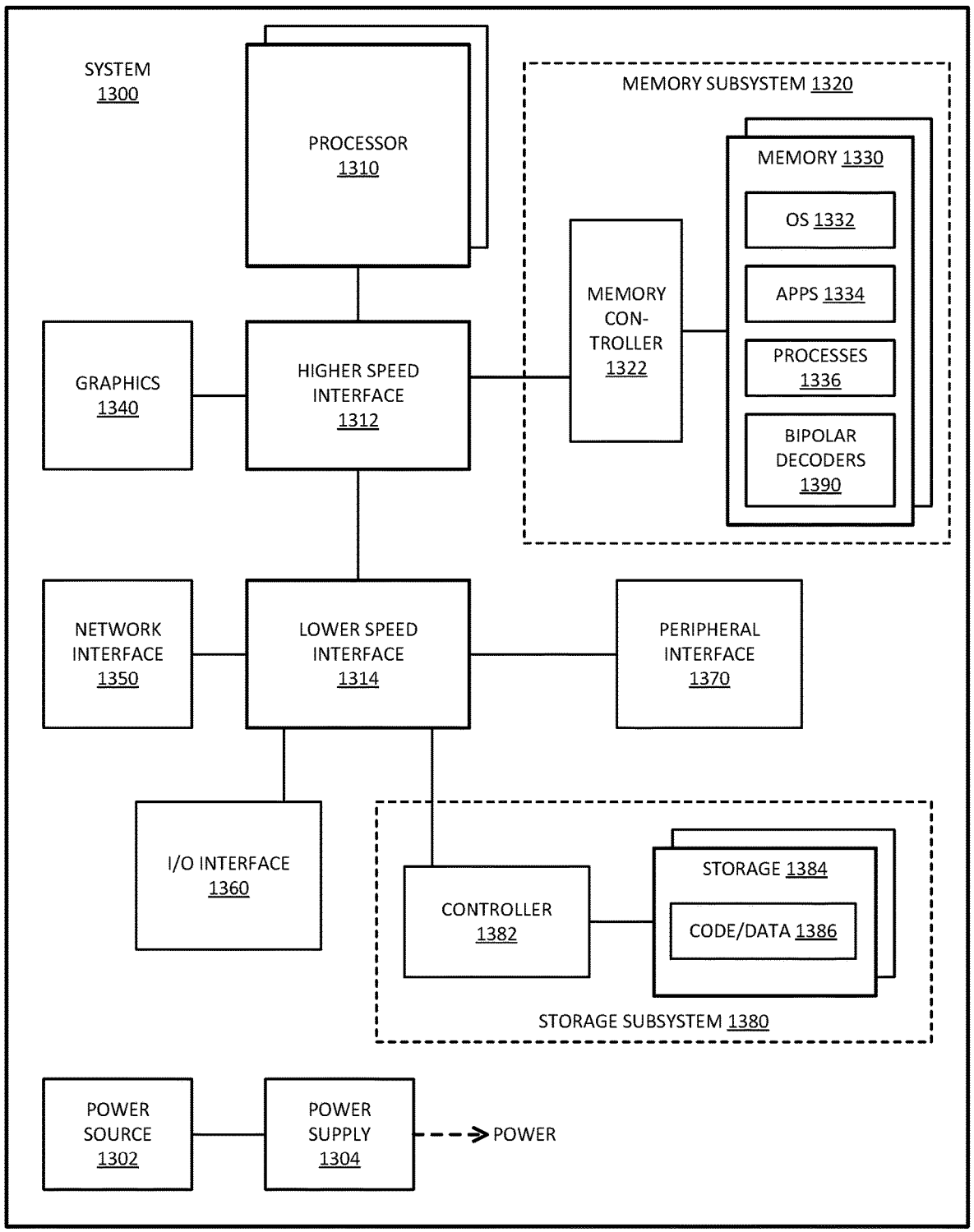
FIG. 13 is a block diagram of an example of a computing system in which a decoder with a device to provide both high voltage bias and low voltage bias can be implemented.

FIG. 13 is a block diagram of an example of a computing system in which a decoder with a device to provide both high voltage bias and low voltage bias can be implemented. System 1300 represents a computing device in accordance with any example herein, and can be a laptop computer, a desktop computer, a tablet computer, a server, a gaming or entertainment control system, embedded computing device, or other electronic device.

System 1300 includes a memory array in memory 1330, which can be a memory array in accordance with an example of system 130 of FIG. 1. In one example, bipolar decoders 1390 represent bipolar decoders in accordance with any example provided herein. The bipolar decoders enable memory 1330 to provide selection of a target cell within the memory array. The use of the described bipolar decoders enables selection with lower energy usage as compared to traditional decoders.

System 1300 includes processor 1310 can include any type of microprocessor, central processing unit (CPU), graphics processing unit (GPU), processing core, or other processing hardware, or a combination, to provide processing or execution of instructions for system 1300. Processor 1310 controls the overall operation of system 1300, and can be or include, one or more programmable general-purpose or special-purpose microprocessors, digital signal processors (DSPs), programmable controllers, application specific integrated circuits (ASICs), programmable logic devices (PLDs), or a combination of such devices.

In one example, system 1300 includes interface 1312 coupled to processor 1310, which can represent a higher speed interface or a high throughput interface for system components that need higher bandwidth connections, such as memory subsystem 1320 or graphics interface components 1340. Interface 1312 represents an interface circuit, which can be a standalone component or integrated onto a processor die. Interface 1312 can be integrated as a circuit onto the processor die or integrated as a component on a system on a chip. Where present, graphics interface 1340 interfaces to graphics components for providing a visual display to a user of system 1300. Graphics interface 1340 can be a standalone component or integrated onto the processor die or system on a chip. In one example, graphics interface 1340 can drive a high definition (HD) display that provides an output to a user. In one example, the display can include a touchscreen display. In one example, graphics interface 1340 generates a display based on data stored in memory 1330 or based on operations executed by processor 1310 or both.

Memory subsystem 1320 represents the main memory of system 1300, and provides storage for code to be executed by processor 1310, or data values to be used in executing a routine. Memory subsystem 1320 can include one or more memory devices 1330 such as read-only memory (ROM), flash memory, one or more varieties of random access memory (RAM) such as DRAM, or other memory devices, or a combination of such devices. Memory 1330 stores and hosts, among other things, operating system (OS) 1332 to provide a software platform for execution of instructions in system 1300. Additionally, applications 1334 can execute on the software platform of OS 1332 from memory 1330. Applications 1334 represent programs that have their own operational logic to perform execution of one or more functions. Processes 1336 represent agents or routines that provide auxiliary functions to OS 1332 or one or more applications 1334 or a combination. OS 1332, applications 1334, and processes 1336 provide software logic to provide functions for system 1300. In one example, memory subsystem 1320 includes memory controller 1322, which is a memory controller to generate and issue commands to memory 1330. It will be understood that memory controller 1322 could be a physical part of processor 1310 or a physical part of interface 1312. For example, memory controller 1322 can be an integrated memory controller, integrated onto a circuit with processor 1310, such as integrated onto the processor die or a system on a chip.

While not specifically illustrated, it will be understood that system 1300 can include one or more buses or bus systems between devices, such as a memory bus, a graphics bus, interface buses, or others. Buses or other signal lines can communicatively or electrically couple components together, or both communicatively and electrically couple the components. Buses can include physical communication lines, point-to-point connections, bridges, adapters, controllers, or other circuitry or a combination. Buses can include, for example, one or more of a system bus, a Peripheral Component Interconnect (PCI) bus, a HyperTransport or industry standard architecture (ISA) bus, a small computer system interface (SCSI) bus, a universal serial bus (USB), or other bus, or a combination.

In one example, system 1300 includes interface 1314, which can be coupled to interface 1312. Interface 1314 can be a lower speed interface than interface 1312. In one example, interface 1314 represents an interface circuit, which can include standalone components and integrated circuitry. In one example, multiple user interface components or peripheral components, or both, couple to interface 1314. Network interface 1350 provides system 1300 the ability to communicate with remote devices (e.g., servers or other computing devices) over one or more networks. Network interface 1350 can include an Ethernet adapter, wireless interconnection components, cellular network interconnection components, USB (universal serial bus), or other wired or wireless standards-based or proprietary interfaces. Network interface 1350 can exchange data with a remote device, which can include sending data stored in memory or receiving data to be stored in memory.

In one example, system 1300 includes one or more input/output (I/O) interface(s) 1360. I/O interface 1360 can include one or more interface components through which a user interacts with system 1300 (e.g., audio, alphanumeric, tactile/touch, or other interfacing). Peripheral interface 1370 can include any hardware interface not specifically mentioned above. Peripherals refer generally to devices that connect dependently to system 1300. A dependent connection is one where system 1300 provides the software platform or hardware platform or both on which operation executes, and with which a user interacts.

In one example, system 1300 includes storage subsystem 1380 to store data in a nonvolatile manner. In one example, in certain system implementations, at least certain components of storage 1380 can overlap with components of memory subsystem 1320. Storage subsystem 1380 includes storage device(s) 1384, which can be or include any conventional medium for storing large amounts of data in a nonvolatile manner, such as one or more magnetic, solid state, or optical based disks, or a combination. Storage 1384 holds code or instructions and data 1386 in a persistent state (i.e., the value is retained despite interruption of power to system 1300). Storage 1384 can be generically considered to be a "memory," although memory 1330 is typically the executing or operating memory to provide instructions to processor 1310. Whereas storage 1384 is nonvolatile, memory 1330 can include volatile memory (i.e., the value or state of the data is indeterminate if power is interrupted to system 1300). In one example, storage subsystem 1380 includes controller 1382 to interface with storage 1384. In one example controller 1382 is a physical part of interface 1314 or processor 1310, or can include circuits or logic in both processor 1310 and interface 1314.

Power source 1302 provides power to the components of system 1300. More specifically, power source 1302 typically interfaces to one or multiple power supplies 1304 in system 1302 to provide power to the components of system 1300. In one example, power supply 1304 includes an AC to DC (alternating current to direct current) adapter to plug into a wall outlet. Such AC power can be renewable energy (e.g., solar power) power source 1302. In one example, power source 1302 includes a DC power source, such as an external AC to DC converter. In one example, power source 1302 or power supply 1304 includes wireless charging hardware to charge via proximity to a charging field. In one example, power source 1302 can include an internal battery or fuel cell source.

Figure 14:
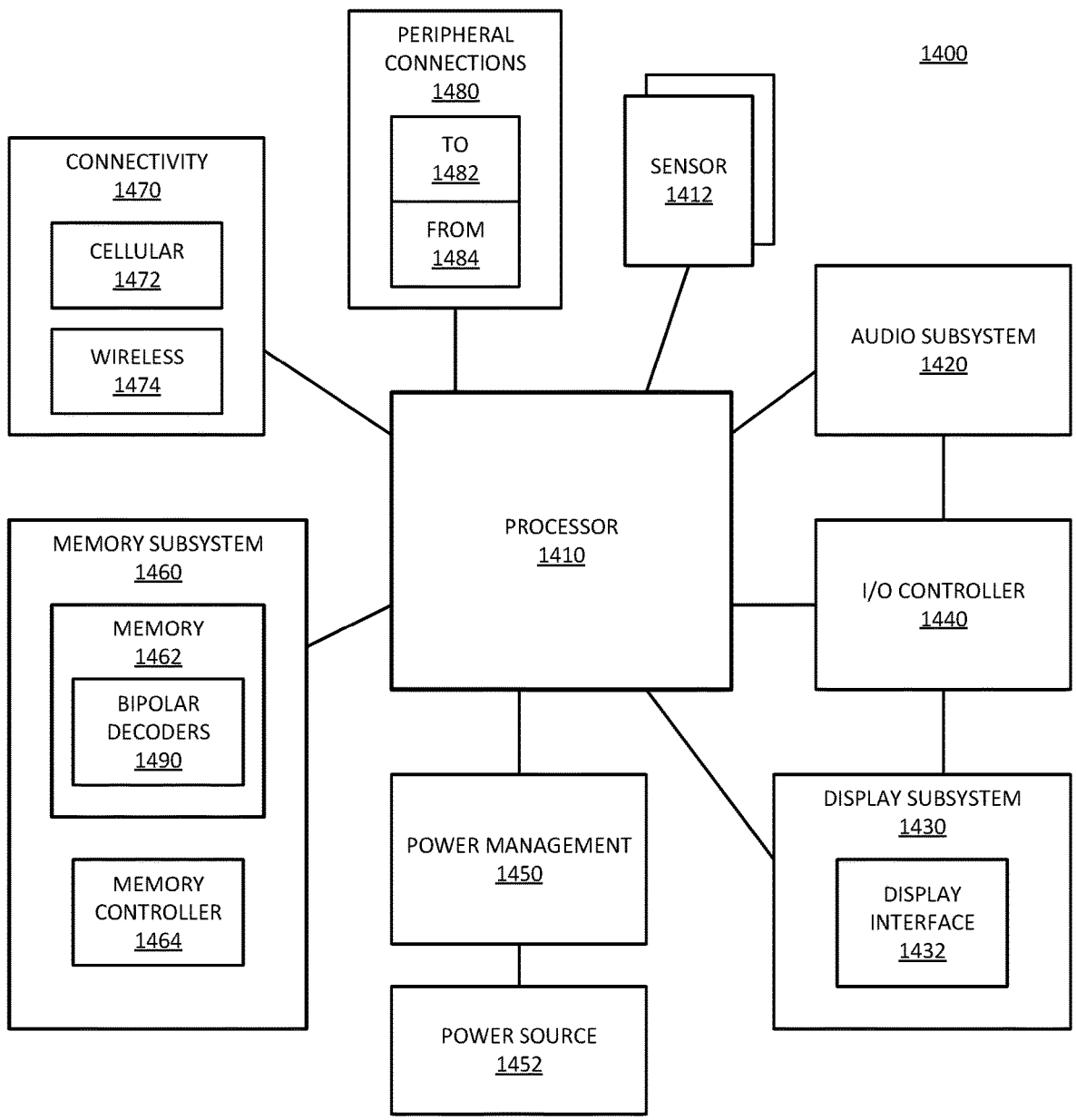
FIG. 14 is a block diagram of an example of a mobile device in which a decoder with a device to provide both high voltage bias and low voltage bias can be implemented.

FIG. 14 is a block diagram of an example of a mobile device in which a decoder with a device to provide both high voltage bias and low voltage bias can be implemented. Device 1400 represents a mobile computing device, such as a computing tablet, a mobile phone or smartphone, wearable computing device, or other mobile device, or an embedded computing device. It will be understood that certain of the components are shown generally, and not all components of such a device are shown in device 1400.

System 1400 includes a memory array in memory 1462, which can be a memory array in accordance with an example of system 130 of FIG. 1. In one example, bipolar decoders 1490 represent bipolar decoders in accordance with any example provided herein. The bipolar decoders enable memory 1462 to provide selection of a target cell within the memory array. The use of the described bipolar decoders enables selection with lower energy usage as compared to traditional decoders.

Device 1400 includes processor 1410, which performs the primary processing operations of device 1400. Processor 1410 can include one or more physical devices, such as microprocessors, application processors, microcontrollers, programmable logic devices, or other processing means. The processing operations performed by processor 1410 include the execution of an operating platform or operating system on which applications and device functions are executed. The processing operations include operations related to I/O (input/output) with a human user or with other devices, operations related to power management, operations related to connecting device 1400 to another device, or a combination. The processing operations can also include operations related to audio I/O, display I/O, or other interfacing, or a combination. Processor 1410 can execute data stored in memory. Processor 1410 can write or edit data stored in memory.

In one example, system 1400 includes one or more sensors 1412. Sensors 1412 represent embedded sensors or interfaces to external sensors, or a combination. Sensors 1412 enable system 1400 to monitor or detect one or more conditions of an environment or a device in which system 1400 is implemented. Sensors 1412 can include environmental sensors (such as temperature sensors, motion detectors, light detectors, cameras, chemical sensors (e.g., carbon monoxide, carbon dioxide, or other chemical sensors)), pressure sensors, accelerometers, gyroscopes, medical or physiology sensors (e.g., biosensors, heart rate monitors, or other sensors to detect physiological attributes), or other sensors, or a combination. Sensors 1412 can also include sensors for biometric systems such as fingerprint recognition systems, face detection or recognition systems, or other systems that detect or recognize user features. Sensors 1412 should be understood broadly, and not limiting on the many different types of sensors that could be implemented with system 1400. In one example, one or more sensors 1412 couples to processor 1410 via a frontend circuit integrated with processor 1410. In one example, one or more sensors 1412 couples to processor 1410 via another component of system 1400.

In one example, device 1400 includes audio subsystem 1420, which represents hardware (e.g., audio hardware and audio circuits) and software (e.g., drivers, codecs) components associated with providing audio functions to the computing device. Audio functions can include speaker or headphone output, as well as microphone input. Devices for such functions can be integrated into device 1400, or connected to device 1400. In one example, a user interacts with device 1400 by providing audio commands that are received and processed by processor 1410.

Display subsystem 1430 represents hardware (e.g., display devices) and software components (e.g., drivers) that provide a visual display for presentation to a user. In one example, the display includes tactile components or touchscreen elements for a user to interact with the computing device. Display subsystem 1430 includes display interface 1432, which includes the particular screen or hardware device used to provide a display to a user. In one example, display interface 1432 includes logic separate from processor 1410 (such as a graphics processor) to perform at least some processing related to the display. In one example, display subsystem 1430 includes a touchscreen device that provides both output and input to a user. In one example, display subsystem 1430 includes a high definition (HD) or ultra-high definition (UHD) display that provides an output to a user. In one example, display subsystem includes or drives a touchscreen display. In one example, display subsystem 1430 generates display information based on data stored in memory or based on operations executed by processor 1410 or both.

I/O controller 1440 represents hardware devices and software components related to interaction with a user. I/O controller 1440 can operate to manage hardware that is part of audio subsystem 1420, or display subsystem 1430, or both. Additionally, I/O controller 1440 illustrates a connection point for additional devices that connect to device 1400 through which a user might interact with the system. For example, devices that can be attached to device 1400 might include microphone devices, speaker or stereo systems, video systems or other display device, keyboard or keypad devices, or other I/O devices for use with specific applications such as card readers or other devices.

As mentioned above, I/O controller 1440 can interact with audio subsystem 1420 or display subsystem 1430 or both. For example, input through a microphone or other audio device can provide input or commands for one or more applications or functions of device 1400. Additionally, audio output can be provided instead of or in addition to display output. In another example, if display subsystem includes a touchscreen, the display device also acts as an input device, which can be at least partially managed by I/O controller 1440. There can also be additional buttons or switches on device 1400 to provide I/O functions managed by I/O controller 1440.

In one example, I/O controller 1440 manages devices such as accelerometers, cameras, light sensors or other environmental sensors, gyroscopes, global positioning system (GPS), or other hardware that can be included in device 1400, or sensors 1412. The input can be part of direct user interaction, as well as providing environmental input to the system to influence its operations (such as filtering for noise, adjusting displays for brightness detection, applying a flash for a camera, or other features).

In one example, device 1400 includes power management 1450 that manages battery power usage, charging of the battery, and features related to power saving operation. Power management 1450 manages power from power source 1452, which provides power to the components of system 1400. In one example, power source 1452 includes an AC to DC (alternating current to direct current) adapter to plug into a wall outlet. Such AC power can be renewable energy (e.g., solar power, motion based power). In one example, power source 1452 includes only DC power, which can be provided by a DC power source, such as an external AC to DC converter. In one example, power source 1452 includes wireless charging hardware to charge via proximity to a charging field. In one example, power source 1452 can include an internal battery or fuel cell source.

Memory subsystem 1460 includes memory device(s) 1462 for storing information in device 1400. Memory subsystem 1460 can include nonvolatile (state does not change if power to the memory device is interrupted) or volatile (state is indeterminate if power to the memory device is interrupted) memory devices, or a combination. Memory 1460 can store application data, user data, music, photos, documents, or other data, as well as system data (whether long-term or temporary) related to the execution of the applications and functions of system 1400. In one example, memory subsystem 1460 includes memory controller 1464 (which could also be considered part of the control of system 1400, and could potentially be considered part of processor 1410). Memory controller 1464 includes a scheduler to generate and issue commands to control access to memory device 1462.

Connectivity 1470 includes hardware devices (e.g., wireless or wired connectors and communication hardware, or a combination of wired and wireless hardware) and software components (e.g., drivers, protocol stacks) to enable device 1400 to communicate with external devices. The external device could be separate devices, such as other computing devices, wireless access points or base stations, as well as peripherals such as headsets, printers, or other devices. In one example, system 1400 exchanges data with an external device for storage in memory or for display on a display device. The exchanged data can include data to be stored in memory, or data already stored in memory, to read, write, or edit data.

Connectivity 1470 can include multiple different types of connectivity. To generalize, device 1400 is illustrated with cellular connectivity 1472 and wireless connectivity 1474. Cellular connectivity 1472 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, LTE (long term evolution—also referred to as "4G"), or other cellular service standards. Wireless connectivity 1474 refers to wireless connectivity that is not cellular, and can include personal area networks (such as Bluetooth), local area networks (such as WiFi), or wide area networks (such as WiMax), or other wireless communication, or a combination. Wireless communication refers to transfer of data through the use of modulated electromagnetic radiation through a non-solid medium. Wired communication occurs through a solid communication medium.

Peripheral connections 1480 include hardware interfaces and connectors, as well as software components (e.g., drivers, protocol stacks) to make peripheral connections. It will be understood that device 1400 could both be a peripheral device ("to" 1482) to other computing devices, as well as have peripheral devices ("from" 1484) connected to it. Device 1400 commonly has a "docking" connector to connect to other computing devices for purposes such as managing (e.g., downloading, uploading, changing, synchronizing) content on device 1400. Additionally, a docking connector can allow device 1400 to connect to certain peripherals that allow device 1400 to control content output, for example, to audiovisual or other systems.

In addition to a proprietary docking connector or other proprietary connection hardware, device 1400 can make peripheral connections 1480 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), or other type.

In general with respect to the descriptions herein, in one example a memory device includes: a crosspoint array of conductors, including rows and columns; and a decoder to select or deselect one of the conductors, the decoder including a driver circuit to apply a bias voltage to select or deselect the conductor; and a select device to selectively provide both high voltage bias and low voltage bias to the driver circuit to enable the driver circuit to apply the bias voltage.

In one example, the decoder to select or deselect one of the conductors comprises the decoder to select or deselect a wordline. In one example, the decoder to select or deselect one of the conductors comprises the decoder to select or deselect a bitline. In one example, the driver circuit to apply the bias voltage comprises a driver circuit with complementary metal oxide semiconductor (CMOS) devices; and wherein the select device comprises a CMOS driver. In one example, the driver circuit to apply the bias voltage comprises a driver circuit with only N-type metal oxide semiconductor (NMOS) devices. In one example, the decoder further comprises a multiplexer to select between the high voltage bias and the low voltage bias. In one example, the select device comprises at least one high voltage transistor, wherein a gate voltage of the select device is not changed when bias polarity is toggled. In one example, the select device comprises only high voltage transistors, wherein gate voltages of the select circuit are not changed when bias polarity is toggled. In one example, the driver circuit comprises at least one high voltage transistor, wherein a gate voltage of the driver circuit is not changed when bias polarity is toggled. In one example, the driver circuit comprises only high voltage transistors, wherein gate voltages of the driver circuit are not changed when bias polarity is toggled. In one example, the select device comprises only low voltage transistors, wherein a gate voltage is switched between a mid voltage reference and a low or high voltage rail instead of switching the gate voltage between the high and low voltage rails. In one example, the circuit is to interface to a local conductor and the select device is to interface with a global conductor.

In general with respect to the descriptions herein, in one example a memory controller interacts with a memory device in accordance with any example of the preceding two paragraphs. In general with respect to the descriptions herein, in one example, a method provides for operations for a memory device in accordance with any example of the two preceding paragraphs. In general with respect to the descriptions herein, in one example, a method provides for operations for a memory controller to interact with a memory device in accordance with any example of the two preceding paragraphs.

In general with respect to the descriptions herein, in one example a system includes: a memory controller; and a memory device coupled to the memory controller, the memory device including a crosspoint array of conductors, including rows and columns; and a decoder to select or deselect one of the conductors, the decoder including a driver circuit to apply a bias voltage to select or deselect the conductor; and a select device to selectively provide both high voltage bias and low voltage bias to the circuit to enable the circuit to apply the bias voltage.

In one example, the decoder to select or deselect one of the conductors comprises the decoder to select or deselect a wordline. In one example, the decoder to select or deselect one of the conductors comprises the decoder to select or deselect a bitline. In one example, the driver circuit to apply the bias voltage comprises a driver circuit with complementary metal oxide semiconductor (CMOS) devices; and wherein the select device comprises a CMOS driver. In one example, the driver circuit to apply the bias voltage comprises a driver circuit with only N-type metal oxide semiconductor (NMOS) devices. In one example, the decoder further comprises a multiplexer to select between the high voltage bias and the low voltage bias. In one example, the select device comprises at least one high voltage transistor, wherein a gate voltage of the select device is not changed when bias polarity is toggled. In one example, the select device comprises only high voltage transistors, wherein gate voltages of the select circuit are not changed when bias polarity is toggled. In one example, the driver circuit comprises at least one high voltage transistor, wherein a gate voltage of the driver circuit is not changed when the bias polarity is toggled. In one example, the driver circuit comprises only high voltage transistors, wherein gate voltages of the driver circuit are not changed when bias polarity is toggled. In one example, the select device comprises only low voltage transistors, wherein a gate voltage is switched between a mid voltage reference and a low or high voltage rail instead of switching the gate voltage between the high and low voltage rails. In one example, the circuit is to interface to a local conductor and the select device is to interface with a global conductor. In one example, the system further includes one or more of: a host processor device coupled to the SSD; a display communicatively coupled to a host processor; a network interface communicatively coupled to a host processor; or a battery to power the system.

Flow diagrams as illustrated herein provide examples of sequences of various process actions. The flow diagrams can indicate operations to be executed by a software or firmware routine, as well as physical operations. A flow diagram can illustrate an example of the implementation of states of a finite state machine (FSM), which can be implemented in hardware and/or software. Although shown in a particular sequence or order, unless otherwise specified, the order of the actions can be modified. Thus, the illustrated diagrams should be understood only as examples, and the process can be performed in a different order, and some actions can be performed in parallel. Additionally, one or more actions can be omitted; thus, not all implementations will perform all actions.

To the extent various operations or functions are described herein, they can be described or defined as software code, instructions, configuration, and/or data. The content can be directly executable ("object" or "executable" form), source code, or difference code ("delta" or "patch" code). The software content of what is described herein can be provided via an article of manufacture with the content stored thereon, or via a method of operating a communication interface to send data via the communication interface. A machine readable storage medium can cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters and/or sending signals to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to what is disclosed and implementations of the invention without departing from their scope. Therefore, the illustrations and examples herein should be construed in an illustrative, and not a restrictive sense. The scope of the invention should be measured solely by reference to the claims that follow.

What is claimed is:

1. A memory device, comprising:
   a crosspoint array of conductors, including rows and columns; and
   a decoder to select or deselect one of the conductors, the decoder including
      a driver circuit to apply a bias voltage to select or deselect the conductor, the driver circuit including a local deselector to selectively couple the conductor to a midline voltage and a local selector to selectively couple the conductor to a global conductor; and
      a select device including a global deselector to selectively couple the local selector to the midline voltage and a global selector to selectively couple the local selector to either a high voltage bias or a low voltage bias.

2. The memory device of claim 1, wherein the decoder to select or deselect one of the conductors comprises the decoder to select or deselect a wordline.

3. The memory device of claim 1, wherein the decoder to select or deselect one of the conductors comprises the decoder to select or deselect a bitline.

4. The memory device of claim 1, wherein the local deselector, the local selector, the global deselector, and the global selector comprise complementary metal oxide semiconductor (CMOS) devices.

5. The memory device of claim 1, wherein the local deselector, the local selector, the global deselector, and the global selector comprise N-type metal oxide semiconductor (NMOS) devices.

6. The memory device of claim 1, wherein the select device comprises a multiplexer to select between the high voltage bias and the low voltage bias.

7. The memory device of claim 1, wherein the global selector comprises a high voltage transistor that can operate with a rail-to-rail voltage differential between gate and drain of the high voltage transistor, wherein a gate voltage of the select device is not changed when bias polarity is toggled.

8. The memory device of claim 7, wherein the global deselector comprises a high voltage transistor.

9. The memory device of claim 7, wherein the local selector comprises a high voltage transistor that can operate with a rail-to-rail voltage differential between the gate and drain, wherein a gate voltage of the driver circuit is not changed when bias polarity is toggled.

10. The memory device of claim 9, wherein the local deselector comprises a high voltage transistor.

11. The memory device of claim 1, wherein the global selector and the local selector comprise low voltage transistors that cannot operate with a rail-to-rail voltage differential between gate and drain of the low voltage transistors, wherein a gate voltage is switched between the midline voltage and a low voltage rail or between the midline voltage and a high voltage rail instead of switching the gate voltage between the high voltage rail and the low voltage rail.

12. A system, comprising:
   a memory controller; and
   a memory device coupled to the memory controller, the memory device including
      a crosspoint array of conductors, including rows and columns; and
      a decoder to select or deselect one of the conductors, the decoder including
         a driver circuit to apply a bias voltage to select or deselect the conductor, the driver circuit including a local deselector to selectively couple the conductor to a midline voltage and a local selector to selectively couple the conductor to a global conductor; and
         a select device including a global deselector to selectively couple the local selector to the midline voltage and a global selector to selectively couple the local selector to either a high voltage bias or a low voltage bias.

13. The system of claim 12, wherein the decoder to select or deselect one of the conductors comprises the decoder to select or deselect a wordline.

14. The system of claim 12, wherein the decoder to select or deselect one of the conductors comprises the decoder to select or deselect a bitline.

15. The system of claim 12, wherein the local deselector, the local selector, the global deselector, and the global selector comprise complementary metal oxide semiconductor (CMOS) devices.

16. The system of claim 12, wherein the local deselector, the local selector, the global deselector, and the global selector comprise N-type metal oxide semiconductor (NMOS) devices.

17. The system of claim 12, wherein the select device comprises a multiplexer to select between the high voltage bias and the low voltage bias.

18. The system of claim 12, wherein the global selector comprises a high voltage transistor that can operate with a rail-to-rail voltage differential between gate and drain of the high voltage transistor, wherein a gate voltage of the select device is not changed when bias polarity is toggled.

19. The memory device of claim 18, wherein the global deselector comprises a high voltage transistor.

20. The system of claim 18, wherein the local selector comprises a high voltage transistor that can operate with a rail-to-rail voltage differential between the gate and drain, wherein a gate voltage of the driver circuit is not changed when bias polarity is toggled.

21. The memory device of claim 20, wherein the local deselector comprises a high voltage transistor.

22. The system of claim 12, wherein the global selector and the local selector comprise low voltage transistors that cannot operate with a rail-to-rail voltage differential between gate and drain of the low voltage transistors, wherein a gate voltage is switched between the midline voltage and a low voltage rail or between the midline voltage and a high voltage rail instead of switching the gate voltage between the high voltage rail and the low voltage rail.

23. The system of claim 12, further comprising one or more of:
- a host processor device coupled to the memory controller;
- a display communicatively coupled to a host processor;
- a network interface communicatively coupled to a host processor; or
- a battery to power the system.

* * * * *